US012707575B2

(12) United States Patent
Chintapatla et al.

(10) Patent No.: US 12,707,575 B2
(45) Date of Patent: Aug. 11, 2026

(54) IPD ADJUSTMENT FOR DISPLAY DEVICES

(71) Applicant: QUALCOMM Incorporated, San Diego, CA (US)

(72) Inventors: Pavan Eswara Kumar Chintapatla, Pedana (IN); Thirukumaran Dechinamoorthy, Hyderabad (IN); Ashwini Ajay Deshmukh, Pune (IN)

(73) Assignee: QUALCOMM Incorporated, San Diego, CA (US)

( * ) Notice: Subject to any disclaimer, the term of this patent is extended or adjusted under 35 U.S.C. 154(b) by 377 days.

(21) Appl. No.: 18/318,693

(22) Filed: May 16, 2023

(65) Prior Publication Data

US 2024/0389247 A1 Nov. 21, 2024

(51) Int. Cl.
*H05K 5/02* (2006.01)
*H05K 7/14* (2006.01)

(52) U.S. Cl.
CPC ............. *H05K 5/0217* (2013.01); *H05K 7/14* (2013.01)

(58) Field of Classification Search
None
See application file for complete search history.

(56) References Cited

U.S. PATENT DOCUMENTS

| | | | | |
|---|---|---|---|---|
| 2012/0328222 | A1* | 12/2012 | Chen | G06F 1/1616 384/26 |
| 2016/0349521 | A1 | 12/2016 | Zhao et al. | |
| 2019/0041643 | A1* | 2/2019 | Chang | H04N 13/398 |
| 2021/0333506 | A1 | 10/2021 | Maric et al. | |

FOREIGN PATENT DOCUMENTS

| | | | | | |
|---|---|---|---|---|---|
| CN | 2469918 | Y | * | 1/2002 | |
| CN | 207571388 | U | | 7/2018 | |
| CN | 111812843 | A | * | 10/2020 | G02B 27/0176 |
| CN | 112099232 | A | * | 12/2020 | G02B 27/0176 |

OTHER PUBLICATIONS

International Search Report and Written Opinion—PCT/US2024/024785—ISA/EPO—Jul. 17, 2024.

* cited by examiner

*Primary Examiner* — Shan Liu
(74) *Attorney, Agent, or Firm* — Procopio, Cory, Hargreaves & Savitch LLP

(57) ABSTRACT

Aspects presented herein relate to methods, devices, and apparatuses for device adjustment. The apparatus may identify a first eye distance of a display device, where the first eye distance of the display device is a length between a left eye display and a right eye display of the display device. The apparatus may also detect whether the first eye distance of the display device is equivalent to a second eye distance of a user of the display device, where the second eye distance of the user is a length between a left eye of the user and a right eye of the user. The apparatus may also adjust the first eye distance of the display device based on the first eye distance of the display device being inequivalent to the second eye distance of the user.

19 Claims, 12 Drawing Sheets

Rear isometric view of device 710

500

Rear isometric view of device 710

IPD ADJUSTMENT FOR DISPLAY DEVICES

TECHNICAL FIELD

The present disclosure relates generally to processing systems and, more particularly, to one or more techniques for interpupillary distance (IPD) adjustment for display devices.

INTRODUCTION

Computing devices often perform graphics and/or display processing (e.g., utilizing a graphics processing unit (GPU), a central processing unit (CPU), a display processor, etc.) to render and display visual content. Such computing devices may include, for example, computer workstations, mobile phones such as smartphones, embedded systems, personal computers, tablet computers, and video game consoles. GPUs are configured to execute a graphics processing pipeline that includes one or more processing stages, which operate together to execute graphics processing commands and output a frame. A central processing unit (CPU) may control the operation of the GPU by issuing one or more graphics processing commands to the GPU. Modern day CPUs are typically capable of executing multiple applications concurrently, each of which may need to utilize the GPU during execution. A display processor is configured to convert digital information received from a CPU to analog values and may issue commands to a display panel for displaying the visual content. A device that provides content for visual presentation on a display may utilize a GPU and/or a display processor.

A GPU of a device may be configured to perform the processes in a graphics processing pipeline. Further, a display processor or display processing unit (DPU) may be configured to perform the processes of display processing. However, with the advent of wireless communication and smaller, handheld devices, there has developed an increased need for improved graphics or display processing.

BRIEF SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method, a computer-readable medium, and an apparatus are provided. The apparatus may be any apparatus that may perform device adjustment. The apparatus may identify a first eye distance of a display device, where the first eye distance of the display device is a length between a left eye display and a right eye display of the display device. Additionally, the apparatus may detect whether the first eye distance of the display device is equivalent to a second eye distance of a user of the display device, where the second eye distance of the user is a length between a left eye of the user and a right eye of the user. The apparatus may also adjust the first eye distance of the display device based on the first eye distance of the display device being inequivalent to the second eye distance of the user. Further, the apparatus may output an indication of the adjustment of the first eye distance of the display device based on the first eye distance of the display device being inequivalent to the second eye distance of the user.

In an aspect of the disclosure, a device or apparatus is provided. The device may include: a screw coupled to at least one nut; and a set of link rods coupled to the at least one nut; where the set of link rods may be configured to adjust a first eye distance of the device based on the first eye distance of the device being inequivalent to a second eye distance of a user of the device, where the first eye distance of the device may be a length between a left eye display and a right eye display of the device, and where the second eye distance of the user may be a length between a left eye of the user and a right eye of the user. The device may further include: a guide rod coupled to the at least one nut; a set of e-rings coupled to at least one of the screw, the at least one nut, or the set of link rods; and a sleeve bearing coupled to the screw.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
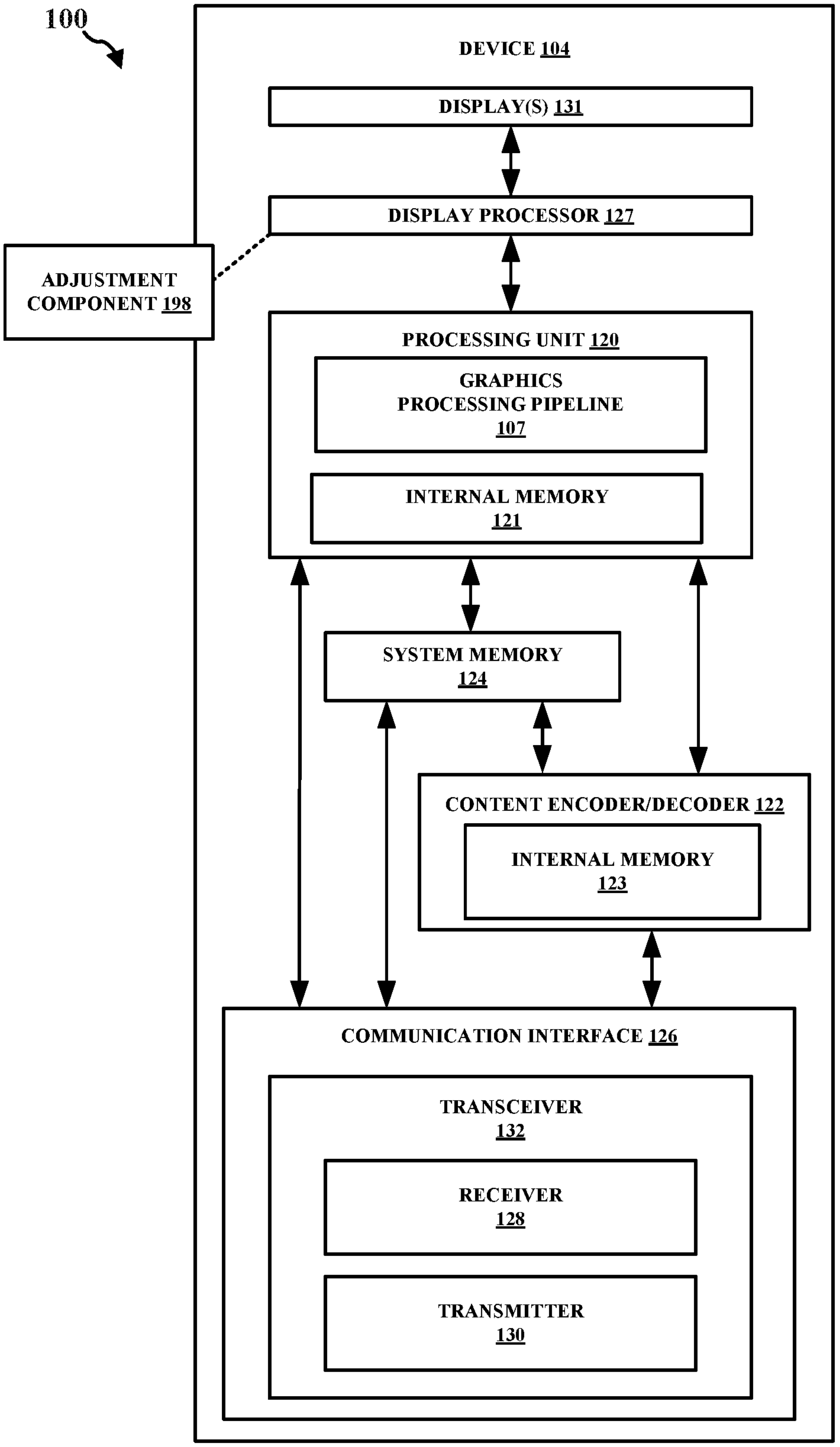
FIG. 1 is a block diagram that illustrates an example content generation system.

Interpupillary distance (IPD) adjustment is a key feature for users in display devices (e.g., extended reality (XR) devices and augmented reality (AR) devices). However, interpupillary distance (IPD) adjustment is a challenging feature on headsets and head-mounted displays (HMDs). Moreover, IPD adjustment may be challenging in certain types of devices (e.g., XR devices and AR devices). That is, existing IPD adjustment mechanisms may be complex from both a design and an assembly perspective. The manufacturing processes may also need special molding tools and more precision as well, as the components may be small which increases the overall cost for these devices. Further, some of the present IPD adjustment mechanisms may be manual, including complex mechanisms that have more moving parts, which can add more weight and also occupy an increased amount of space. Aspects of the present disclosure may utilize a mechanism to adjust the interpupillary distance of a device that is simple to operate. Also, aspects presented herein may utilize a mechanism that uses a reduced amount of space in order to adjust the interpupillary distance (IPD) of a device, as well as is less expensive to operate.

Aspects presented herein may include a number of benefits or advantages. For instance, aspects presented herein may utilize a screw and nut mechanism for IPD adjustment. In turn, this may reduce the amount of cost by reducing the manufacturing cost for the mechanism. Also, aspects presented herein may utilize a reduced number of components for the IPD adjustment. Aspects presented herein may also reduce or eliminate the amount of play (i.e., the amount of lost motion due to clearance or slackness) between moving parts. Further, aspects presented herein may allow for a controlled translation of IPD adjustment. Aspects presents herein may also include robust IPD adjustment mechanisms that include a higher amount of load. Moreover, IPD adjustment mechanisms herein may utilize a reduced amount of space in the display device, utilize a reduced amount of effort to operate to mechanism, as well as be easy to assemble.

Various aspects of systems, apparatuses, computer program products, and methods are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of this disclosure to those skilled in the art. Based on the teachings herein one skilled in the art should appreciate that the scope of this disclosure is intended to cover any aspect of the systems, apparatuses, computer program products, and methods disclosed herein, whether implemented independently of, or combined with, other aspects of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. Any aspect disclosed herein may be embodied by one or more elements of a claim.

Although various aspects are described herein, many variations and permutations of these aspects fall within the scope of this disclosure. Although some potential benefits and advantages of aspects of this disclosure are mentioned, the scope of this disclosure is not intended to be limited to particular benefits, uses, or objectives. Rather, aspects of this disclosure are intended to be broadly applicable to different wireless technologies, system configurations, networks, and transmission protocols, some of which are illustrated by way of example in the figures and in the following description. The detailed description and drawings are merely illustrative of this disclosure rather than limiting, the scope of this disclosure being defined by the appended claims and equivalents thereof.

Several aspects are presented with reference to various apparatus and methods. These apparatus and methods are described in the following detailed description and illustrated in the accompanying drawings by various blocks, components, circuits, processes, algorithms, and the like (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors (which may also be referred to as processing units). Examples of processors include microprocessors, microcontrollers, graphics processing units (GPUs), general purpose GPUs (GPGPUs), central processing units (CPUs), application processors, digital signal processors (DSPs), reduced instruction set computing (RISC) processors, systems-on-chip (SOC), baseband processors, application specific integrated circuits (ASICs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software may be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise. The term application may refer to software. As described herein, one or more techniques may refer to an application, i.e., software, being configured to perform one or more functions. In such examples, the application may be stored on a memory, e.g., on-chip memory of a processor, system memory, or any other memory. Hardware described herein, such as a processor may be configured to execute the application. For example, the application may be described as including code that, when executed by the hardware, causes the hardware to perform one or more techniques described herein. As an example, the hardware may access the code from a memory and execute the code accessed from the memory to perform one or more techniques described herein. In some examples, components are identified in this disclosure. In such examples, the components may be hardware, software, or a combination thereof. The components may be separate components or sub-components of a single component.

Accordingly, in one or more examples described herein, the functions described may be implemented in hardware, software, or any combination thereof. If implemented in software, the functions may be stored on or encoded as one or more instructions or code on a computer-readable medium. Computer-readable media includes computer storage media. Storage media may be any available media that may be accessed by a computer. By way of example, and not limitation, such computer-readable media may comprise a random access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that may be used to store computer executable code in the form of instructions or data structures that may be accessed by a computer.

In general, this disclosure describes techniques for having a graphics processing pipeline in a single device or multiple devices, improving the rendering of graphical content, and/ or reducing the load of a processing unit, i.e., any processing unit configured to perform one or more techniques described herein, such as a GPU. For example, this disclosure describes techniques for graphics processing in any device that utilizes graphics processing. Other example benefits are described throughout this disclosure.

As used herein, instances of the term "content" may refer to "graphical content," "image," and vice versa. This is true regardless of whether the terms are being used as an adjective, noun, or other parts of speech. In some examples, as used herein, the term "graphical content" may refer to a content produced by one or more processes of a graphics processing pipeline. In some examples, as used herein, the term "graphical content" may refer to a content produced by a processing unit configured to perform graphics processing. In some examples, as used herein, the term "graphical content" may refer to a content produced by a graphics processing unit.

In some examples, as used herein, the term "display content" may refer to content generated by a processing unit configured to perform displaying processing. In some examples, as used herein, the term "display content" may refer to content generated by a display processing unit. Graphical content may be processed to become display content. For example, a graphics processing unit may output graphical content, such as a frame, to a buffer (which may be referred to as a framebuffer). A display processing unit may read the graphical content, such as one or more frames from the buffer, and perform one or more display processing techniques thereon to generate display content. For example, a display processing unit may be configured to perform composition on one or more rendered layers to generate a frame. As another example, a display processing unit may be configured to compose, blend, or otherwise combine two or more layers together into a single frame. A display processing unit may be configured to perform scaling, e.g., upscaling or downscaling, on a frame. In some examples, a frame may refer to a layer. In other examples, a frame may refer to two or more layers that have already been blended together to form the frame, i.e., the frame includes two or more layers, and the frame that includes two or more layers may subsequently be blended.

FIG. 1 is a block diagram that illustrates an example content generation system 100 configured to implement one or more techniques of this disclosure. The content generation system 100 includes a device 104. The device 104 may include one or more components or circuits for performing various functions described herein. In some examples, one or more components of the device 104 may be components of an SOC. The device 104 may include one or more components configured to perform one or more techniques of this disclosure. In the example shown, the device 104 may include a processing unit 120, a content encoder/decoder 122, and a system memory 124. In some aspects, the device 104 may include a number of components, e.g., a communication interface 126, a transceiver 132, a receiver 128, a transmitter 130, a display processor 127, and one or more displays 131. Reference to the display 131 may refer to the one or more displays 131. For example, the display 131 may include a single display or multiple displays. The display 131 may include a first display and a second display. The first display may be a left-eye display and the second display may be a right-eye display. In some examples, the first and second display may receive different frames for presentment thereon. In other examples, the first and second display may receive the same frames for presentment thereon. In further examples, the results of the graphics processing may not be displayed on the device, e.g., the first and second display may not receive any frames for presentment thereon. Instead, the frames or graphics processing results may be transferred to another device. In some aspects, this may be referred to as split-rendering.

The processing unit 120 may include an internal memory 121. The processing unit 120 may be configured to perform graphics processing, such as in a graphics processing pipeline 107. The content encoder/decoder 122 may include an internal memory 123. In some examples, the device 104 may include a display processor, such as the display processor 127, to perform one or more display processing techniques on one or more frames generated by the processing unit 120 before presentment by the one or more displays 131. The display processor 127 may be configured to perform display processing. For example, the display processor 127 may be configured to perform one or more display processing techniques on one or more frames generated by the processing unit 120. The one or more displays 131 may be configured to display or otherwise present frames processed by the display processor 127. In some examples, the one or more displays 131 may include one or more of: a liquid crystal display (LCD), a plasma display, an organic light emitting diode (OLED) display, a projection display device, an augmented reality display device, a virtual reality display device, a head-mounted display, or any other type of display device.

Memory external to the processing unit 120 and the content encoder/decoder 122, such as system memory 124, may be accessible to the processing unit 120 and the content encoder/decoder 122. For example, the processing unit 120 and the content encoder/decoder 122 may be configured to read from and/or write to external memory, such as the system memory 124. The processing unit 120 and the content encoder/decoder 122 may be communicatively coupled to the system memory 124 over a bus. In some examples, the processing unit 120 and the content encoder/decoder 122 may be communicatively coupled to each other over the bus or a different connection.

The content encoder/decoder 122 may be configured to receive graphical content from any source, such as the system memory 124 and/or the communication interface 126. The system memory 124 may be configured to store received encoded or decoded graphical content. The content encoder/decoder 122 may be configured to receive encoded or decoded graphical content, e.g., from the system memory 124 and/or the communication interface 126, in the form of encoded pixel data. The content encoder/decoder 122 may be configured to encode or decode any graphical content. The internal memory 121 or the system memory 124 may include one or more volatile or non-volatile memories or storage devices. In some examples, internal memory 121 or the system memory 124 may include RAM, SRAM, DRAM, erasable programmable ROM (EPROM), electrically erasable programmable ROM (EEPROM), flash memory, a magnetic data media or an optical storage media, or any other type of memory.

The internal memory 121 or the system memory 124 may be a non-transitory storage medium according to some examples. The term "non-transitory" may indicate that the storage medium is not embodied in a carrier wave or a propagated signal. However, the term "non-transitory" should not be interpreted to mean that internal memory 121 or the system memory 124 is non-movable or that its contents are static. As one example, the system memory 124 may be removed from the device 104 and moved to another device. As another example, the system memory 124 may not be removable from the device 104.

The processing unit 120 may be a central processing unit (CPU), a graphics processing unit (GPU), a general purpose GPU (GPGPU), or any other processing unit that may be configured to perform graphics processing. In some examples, the processing unit 120 may be integrated into a motherboard of the device 104. In some examples, the processing unit 120 may be present on a graphics card that is installed in a port in a motherboard of the device 104, or may be otherwise incorporated within a peripheral device configured to interoperate with the device 104. The processing unit 120 may include one or more processors, such as one or more microprocessors, GPUs, application specific integrated circuits (ASICs), field programmable gate arrays (FPGAs), arithmetic logic units (ALUs), digital signal processors (DSPs), discrete logic, software, hardware, firmware, other equivalent integrated or discrete logic circuitry, or any combinations thereof. If the techniques are implemented partially in software, the processing unit 120 may store instructions for the software in a suitable, non-transitory computer-readable storage medium, e.g., internal memory 121, and may execute the instructions in hardware using one or more processors to perform the techniques of this disclosure. Any of the foregoing, including hardware, software, a combination of hardware and software, etc., may be considered to be one or more processors.

The content encoder/decoder 122 may be any processing unit configured to perform content decoding. In some examples, the content encoder/decoder 122 may be integrated into a motherboard of the device 104. The content encoder/decoder 122 may include one or more processors, such as one or more microprocessors, application specific integrated circuits (ASICs), field programmable gate arrays (FPGAs), arithmetic logic units (ALUs), digital signal processors (DSPs), video processors, discrete logic, software, hardware, firmware, other equivalent integrated or discrete logic circuitry, or any combinations thereof. If the techniques are implemented partially in software, the content encoder/decoder 122 may store instructions for the software in a suitable, non-transitory computer-readable storage medium, e.g., internal memory 123, and may execute the instructions in hardware using one or more processors to perform the techniques of this disclosure. Any of the foregoing, including hardware, software, a combination of hardware and software, etc., may be considered to be one or more processors.

In some aspects, the content generation system 100 may include a communication interface 126. The communication interface 126 may include a receiver 128 and a transmitter 130. The receiver 128 may be configured to perform any receiving function described herein with respect to the device 104. Additionally, the receiver 128 may be configured to receive information, e.g., eye or head position information, rendering commands, or location information, from another device. The transmitter 130 may be configured to perform any transmitting function described herein with respect to the device 104. For example, the transmitter 130 may be configured to transmit information to another device, which may include a request for content. The receiver 128 and the transmitter 130 may be combined into a transceiver 132. In such examples, the transceiver 132 may be configured to perform any receiving function and/or transmitting function described herein with respect to the device 104.

Referring again to FIG. 1, in certain aspects, the display processor 127 may include an adjustment component 198 configured to identify a first eye distance of a display device, where the first eye distance of the display device is a length between a left eye display and a right eye display of the display device. The adjustment component 198 may also be configured to detect whether the first eye distance of the display device is equivalent to a second eye distance of a user of the display device, where the second eye distance of the user is a length between a left eye of the user and a right eye of the user. The adjustment component 198 may also be configured to adjust the first eye distance of the display device based on the first eye distance of the display device being inequivalent to the second eye distance of the user. The adjustment component 198 may also be configured to output an indication of the adjustment of the first eye distance of the display device based on the first eye distance of the display device being inequivalent to the second eye distance of the user.

Although the following description may be focused on device adjustment or display processing, the concepts described herein may be applicable to other similar processing techniques.

As described herein, a device, such as the device 104, may refer to any device, apparatus, or system configured to perform one or more techniques described herein. For example, a device may be a server, a base station, user equipment, a client device, a station, an access point, a computer, e.g., a personal computer, a desktop computer, a laptop computer, a tablet computer, a computer workstation, or a mainframe computer, an end product, an apparatus, a phone, a smart phone, a server, a video game platform or console, a handheld device, e.g., a portable video game device or a personal digital assistant (PDA), a wearable computing device, e.g., a smart watch, an augmented reality device, or a virtual reality device, a non-wearable device, a display or display device, a television, a television set-top box, an intermediate network device, a digital media player, a video streaming device, a content streaming device, an in-car computer, any mobile device, any device configured to generate graphical content, or any device configured to perform one or more techniques described herein. Processes herein may be described as performed by a particular component (e.g., a GPU), but, in further embodiments, may be performed using other components (e.g., a CPU), consistent with disclosed embodiments.

GPUs may process multiple types of data or data packets in a GPU pipeline. For instance, in some aspects, a GPU may process two types of data or data packets, e.g., context register packets and draw call data. A context register packet may be a set of global state information, e.g., information regarding a global register, shading program, or constant data, which may regulate how a graphics context will be processed. For example, context register packets may include information regarding a color format. In some aspects of context register packets, there may be a bit that indicates which workload belongs to a context register. Also, there may be multiple functions or programming running at the same time and/or in parallel. For example, functions or programming may describe a certain operation, e.g., the color mode or color format. Accordingly, a context register may define multiple states of a GPU.

Context states may be utilized to determine how an individual processing unit functions, e.g., a vertex fetcher (VFD), a vertex shader (VS), a shader processor, or a geometry processor, and/or in what mode the processing unit functions. In order to do so, GPUs may use context registers and programming data. In some aspects, a GPU may generate a workload, e.g., a vertex or pixel workload, in the pipeline based on the context register definition of a mode or state. Certain processing units, e.g., a VFD, may use these states to determine certain functions, e.g., how a vertex is assembled. As these modes or states may change, GPUs may need to change the corresponding context. Additionally, the workload that corresponds to the mode or state may follow the changing mode or state.

Figure 2:
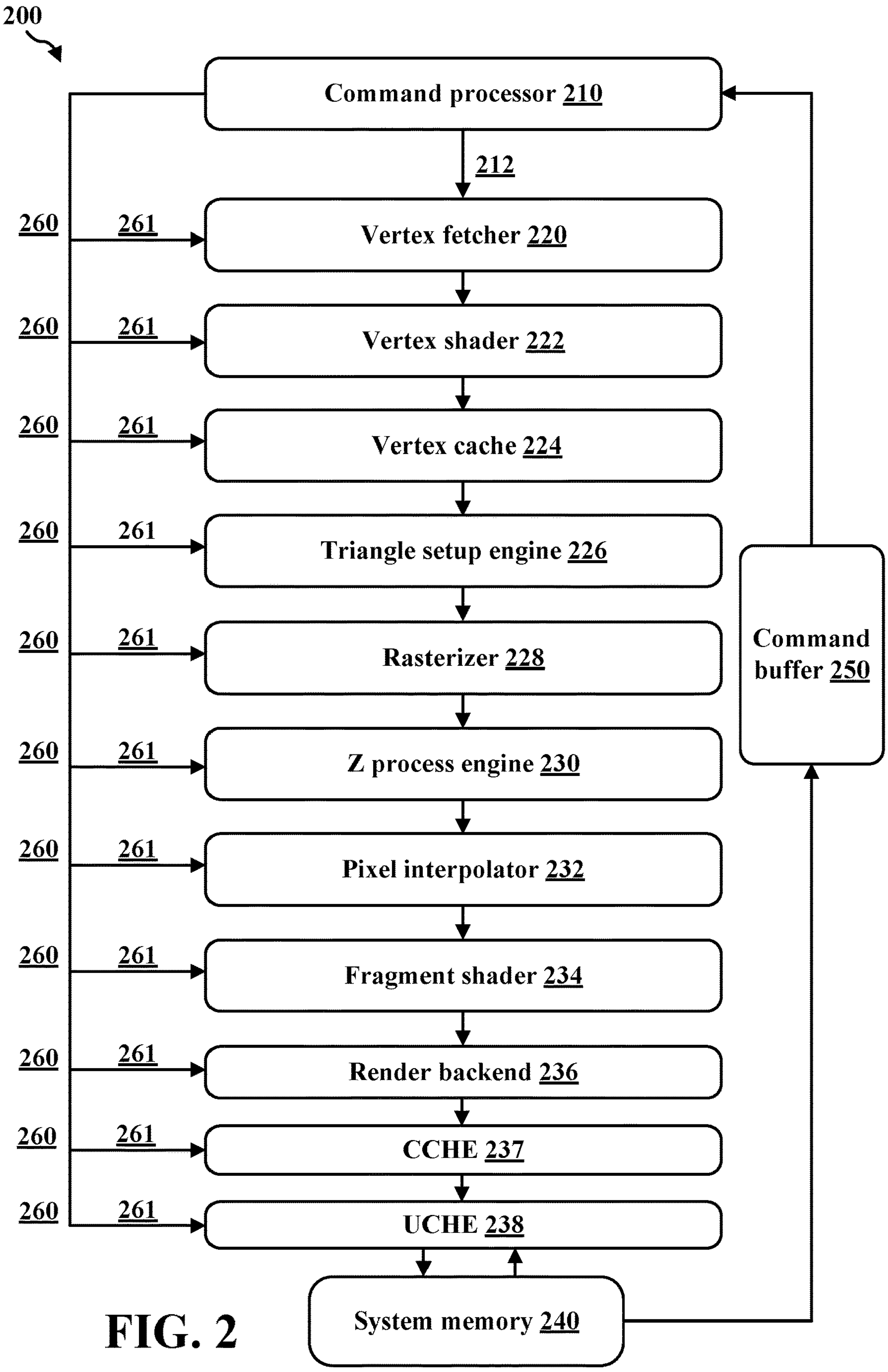
FIG. 2 illustrates an example graphics processing unit (GPU).

FIG. 2 illustrates an example GPU 200 in accordance with one or more techniques of this disclosure. As shown in FIG. 2, GPU 200 includes command processor (CP) 210, draw call packets 212, VFD 220, VS 222, vertex cache (VPC) 224, triangle setup engine (TSE) 226, rasterizer (RAS) 228, Z process engine (ZPE) 230, pixel interpolator (PI) 232, fragment shader (FS) 234, render backend (RB) 236, level 1 (L1) cache (cluster cache (CCHE)) 237, level 2 (L2) cache (UCHE) 238, and system memory 240. Although FIG. 2 displays that GPU 200 includes processing units 220-238, GPU 200 may include a number of additional processing units. Additionally, processing units 220-238 are merely an example and any combination or order of processing units may be used by GPUs according to the present disclosure. GPU 200 also includes command buffer 250, context register packets 260, and context states 261.

As shown in FIG. 2, a GPU may utilize a CP, e.g., CP 210, or hardware accelerator to parse a command buffer into context register packets, e.g., context register packets 260, and/or draw call data packets, e.g., draw call packets 212. The CP 210 may then send the context register packets 260 or draw call packets 212 through separate paths to the processing units or blocks in the GPU. Further, the command buffer 250 may alternate different states of context registers and draw calls. For example, a command buffer may be structured in the following manner: context register of context N, draw call(s) of context N, context register of context N+1, and draw call(s) of context N+1.

GPUs may render images in a variety of different ways. In some instances, GPUs may render an image using rendering and/or tiled rendering. In tiled rendering GPUs, an image may be divided or separated into different sections or tiles. After the division of the image, each section or tile may be rendered separately. Tiled rendering GPUs may divide computer graphics images into a grid format, such that each portion of the grid, i.e., a tile, is separately rendered. In some aspects, during a binning pass, an image may be divided into different bins or tiles. In some aspects, during the binning pass, a visibility stream may be constructed where visible primitives or draw calls may be identified. In contrast to tiled rendering, direct rendering does not divide the frame into smaller bins or tiles. Rather, in direct rendering, the entire frame is rendered at a single time. Additionally, some types of GPUs may allow for both tiled rendering and direct rendering.

Instructions executed by a CPU (e.g., software instructions) or a display processor may cause the CPU or the display processor to search for and/or generate a composition strategy for composing a frame based on a dynamic priority and runtime statistics associated with one or more composition strategy groups. A frame to be displayed by a physical display device, such as a display panel, may include a plurality of layers. Also, composition of the frame may be based on combining the plurality of layers into the frame (e.g., based on a frame buffer). After the plurality of layers are combined into the frame, the frame may be provided to the display panel for display thereon. The process of combining each of the plurality of layers into the frame may be referred to as composition, frame composition, a composition procedure, a composition process, or the like.

A frame composition procedure or composition strategy may correspond to a technique for composing different layers of the plurality of layers into a single frame. The plurality of layers may be stored in doubled data rate (DDR) memory. Each layer of the plurality of layers may further correspond to a separate buffer. A composer or hardware composer (HWC) associated with a block or function may determine an input of each layer/buffer and perform the frame composition procedure to generate an output indicative of a composed frame. That is, the input may be the layers and the output may be a frame composition procedure for composing the frame to be displayed on the display panel.

Figure 3:
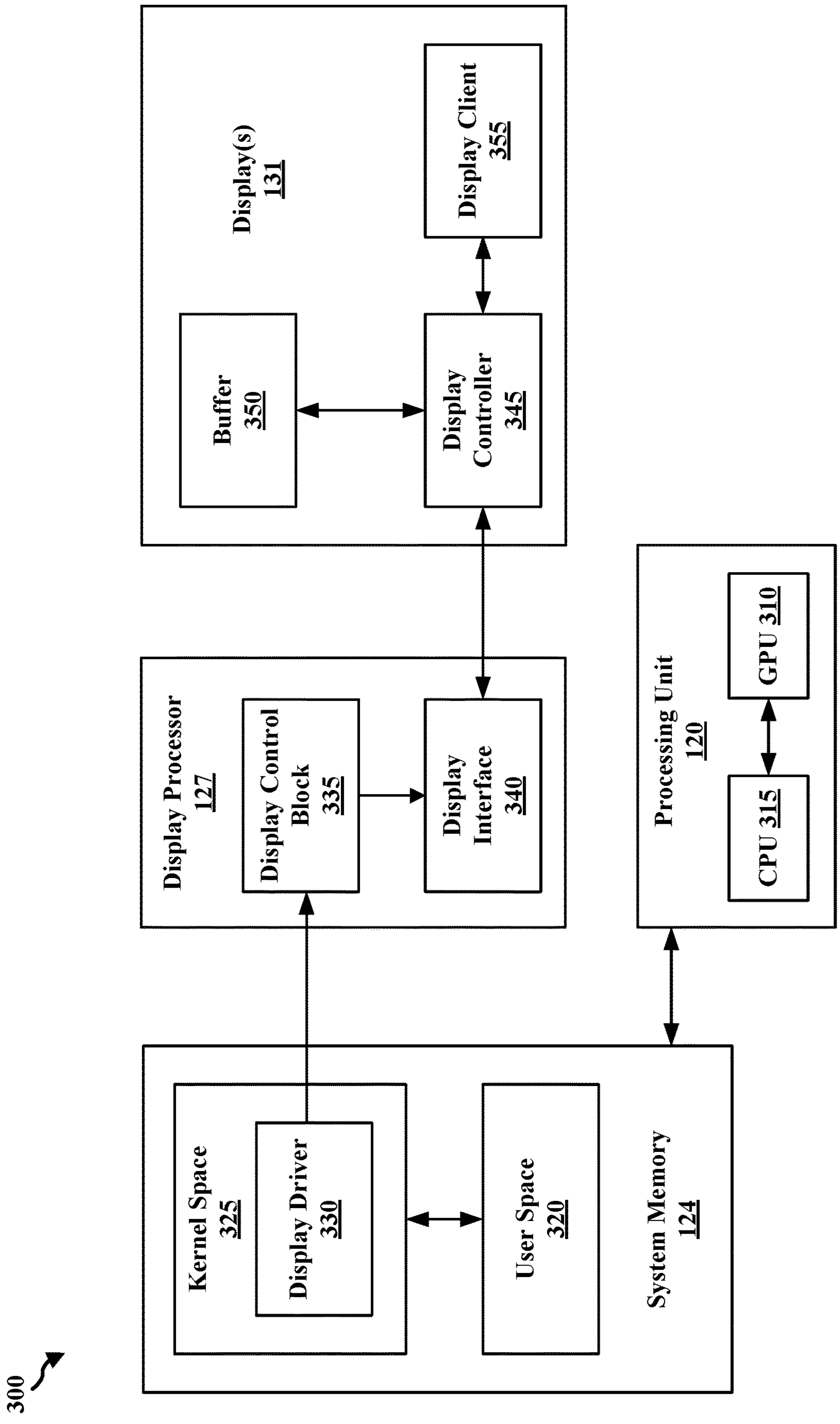
FIG. 3 is a diagram illustrating example processing components.

FIG. 3 is a block diagram 300 that illustrates an example display framework including the processing unit 120, the system memory 124, the display processor 127, and the display(s) 131, as may be identified in connection with the device 104.

A GPU may be included in devices that provide content for visual presentation on a display. For example, the processing unit 120 may include a GPU 310 configured to render graphical data for display on a computing device (e.g., the device 104), which may be a computer workstation, a mobile phone, a smartphone or other smart device, an embedded system, a personal computer, a tablet computer, a video game console, and the like. Operations of the GPU 310 may be controlled based on one or more graphics processing commands provided by a CPU 315. The CPU 315 may be configured to execute multiple applications concurrently. In some cases, each of the concurrently executed multiple applications may utilize the GPU 310 simultaneously. Processing techniques may be performed via the processing unit 120 output a frame over physical or wireless communication channels.

The system memory 124, which may be executed by the processing unit 120, may include a user space 320 and a kernel space 325. The user space 320 (sometimes referred to as an "application space") may include software application(s) and/or application framework(s). For example, software application(s) may include operating systems, media applications, graphical applications, workspace applications, etc. Application framework(s) may include frameworks used by one or more software applications, such as libraries, services (e.g., display services, input services, etc.), application program interfaces (APIs), etc. The kernel space 325 may further include a display driver 330. The display driver 330 may be configured to control the display processor 127. For example, the display driver 330 may cause the display processor 127 to compose a frame and transmit the data for the frame to a display.

The display processor 127 includes a display control block 335 and a display interface 340. The display processor 127 may be configured to manipulate functions of the display(s) 131 (e.g., based on an input received from the display driver 330). The display control block 335 may be further configured to output image frames to the display(s) 131 via the display interface 340. In some examples, the display control block 335 may additionally or alternatively perform post-processing of image data provided based on execution of the system memory 124 by the processing unit 120.

The display interface 340 may be configured to cause the display(s) 131 to display image frames. The display interface 340 may output image data to the display(s) 131 according to an interface protocol, such as, for example, the MIPI DSI (Mobile Industry Processor Interface, Display Serial Interface). That is, the display(s) 131, may be configured in accordance with MIPI DSI standards. The MIPI DSI standard supports a video mode and a command mode. In examples where the display(s) 131 is/are operating in video mode, the display processor 127 may continuously refresh the graphical content of the display(s) 131. For example, the entire graphical content may be refreshed per refresh cycle (e.g., line-by-line). In examples where the display(s) 131 is/are operating in command mode, the display processor 127 may write the graphical content of a frame to a buffer 350.

In some such examples, the display processor 127 may not continuously refresh the graphical content of the display(s) 131. Instead, the display processor 127 may use a vertical synchronization (Vsync) pulse to coordinate rendering and consuming of graphical content at the buffer 350. For example, when a Vsync pulse is generated, the display processor 127 may output new graphical content to the buffer 350. Thus, generation of the Vsync pulse may indicate that current graphical content has been rendered at the buffer 350.

Frames are displayed at the display(s) 131 based on a display controller 345, a display client 355, and the buffer 350. The display controller 345 may receive image data from the display interface 340 and store the received image data in the buffer 350. In some examples, the display controller 345 may output the image data stored in the buffer 350 to the display client 355. Thus, the buffer 350 may represent a local memory to the display(s) 131. In some examples, the display controller 345 may output the image data received from the display interface 340 directly to the display client 355.

The display client 355 may be associated with a touch panel that senses interactions between a user and the display(s) 131. As the user interacts with the display(s) 131, one or more sensors in the touch panel may output signals to the display controller 345 that indicate which of the one or more sensors have sensor activity, a duration of the sensor activity, an applied pressure to the one or more sensor, etc. The display controller 345 may use the sensor outputs to determine a manner in which the user has interacted with the display(s) 131. The display(s) 131 may be further associated with/include other devices, such as a camera, a microphone, and/or a speaker, that operate in connection with the display client 355.

Some processing techniques of the device 104 may be performed over three stages (e.g., stage 1: a rendering stage; stage 2: a composition stage; and stage 3: a display/transfer stage). However, other processing techniques may combine the composition stage and the display/transfer stage into a single stage, such that the processing technique may be executed based on two total stages (e.g., stage 1: the rendering stage; and stage 2: the composition/display/transfer stage). During the rendering stage, the GPU 310 may process a content buffer based on execution of an application that generates content on a pixel-by-pixel basis. During the composition and display stage(s), pixel elements may be assembled to form a frame that is transferred to a physical display panel/subsystem (e.g., the displays 131) that displays the frame.

Instructions executed by a CPU (e.g., software instructions) or a display processor may cause the CPU or the display processor to search for and/or generate a composition strategy for composing a frame based on a dynamic priority and runtime statistics associated with one or more composition strategy groups. A frame to be displayed by a physical display device, such as a display panel, may include a plurality of layers. Also, composition of the frame may be based on combining the plurality of layers into the frame (e.g., based on a frame buffer). After the plurality of layers are combined into the frame, the frame may be provided to the display panel for display thereon. The process of combining each of the plurality of layers into the frame may be referred to as composition, frame composition, a composition procedure, a composition process, or the like.

A frame composition procedure or composition strategy may correspond to a technique for composing different layers of the plurality of layers into a single frame. The plurality of layers may be stored in doubled data rate (DDR) memory. Each layer of the plurality of layers may further correspond to a separate buffer. A composer or hardware composer (HWC) associated with a block or function may determine an input of each layer/buffer and perform the frame composition procedure to generate an output indicative of a composed frame. That is, the input may be the layers and the output may be a frame composition procedure for composing the frame to be displayed on the display panel.

Some aspects of display processing may utilize different types of mask layers, e.g., a shape mask layer. A mask layer is a layer that may represent a portion of a display or display panel. For instance, an area of a mask layer may correspond to an area of a display, but the entire mask layer may depict a portion of the content that is actually displayed at the display or panel. For example, a mask layer may include a top portion and a bottom portion of a display area, but the middle portion of the mask layer may be empty. In some examples, there may be multiple mask layers to represent different portions of a display area. Also, for certain portions of a display area, the content of different mask layers may overlap with one another. Accordingly, a mask layer may represent a portion of a display area that may or may not overlap with other mask layers.

Figure 4:
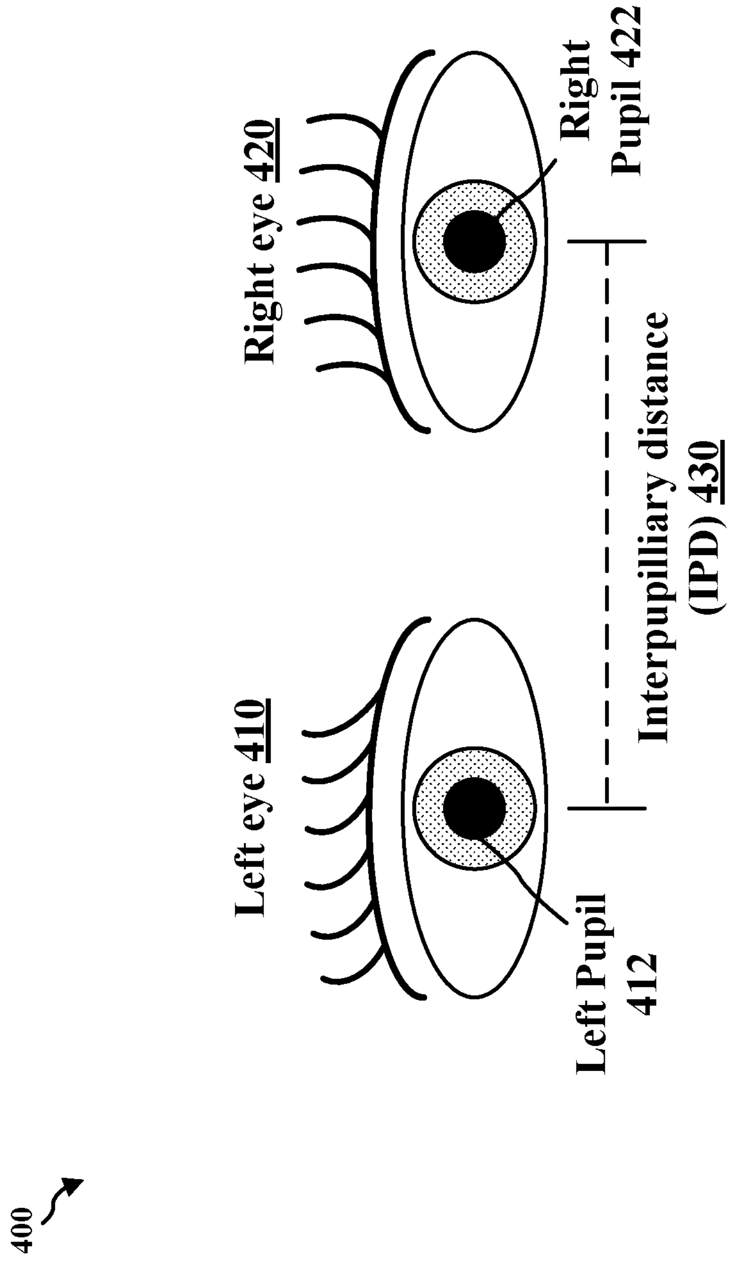
FIG. 4 is a diagram illustrating an example distance between eyes.

FIG. 4 is a diagram 400 illustrating an example distance between eyes. More specifically, FIG. 4 depicts an interpupillary distance (IPD) between a left eye 410 and a right eye 420. As shown in FIG. 4, diagram 400 includes left eye 410, left pupil 412, right eye 420, right pupil 422, and interpupillary distance 430. As illustrated in FIG. 4, an interpupillary distance (IPD) is the distance between the center of the pupils between two eyes. For instance, interpupillary distance 430 is equal to the distance between the center of left pupil 412 and the center of right pupil 422.

As depicted in FIG. 4, interpupillary distance (IPD) is the distance between the center of the pupils of eyes. For instance, interpupillary distance can determine the degree of retinal image disparity in fellow eyes which are combined in the brain to produce stereo perception. Interpupillary distance may be important for the design of certain viewing systems (e.g., binocular viewing systems), where both eye pupils may need to be positioned within the exit pupils of the viewing system. For example, these types of viewing systems may include binocular microscopes, night vision devices or goggles, and head-mounted displays (HMDs). Interpupillary distance data may be used in the design of such systems in order to specify the range of lateral adjustment of the exit optics or eyepieces. The interpupillary distance may also be used to describe the distance between the exit pupils or optical axes of a binocular optical system. In one aspect, a distinction with IPD may be the importance of anthropometric databases and the design of binocular viewing devices with an IPD adjustment that will fit certain types of users.

Instruments such as optical instruments or HMDs may be used by a number of different people, so the distance between the eye pieces may be adjustable in order to account for the interpupillary distance. Adjusting the distance between the displays as per the individual's interpupillary distance is widely adopted in immersive visualization systems to improve user experience. IPD adjustment may allow the user to customize the lens so that the user can see a clear, focused image through the lens. For instance, IPD adjustment may allow the user to see a clear, focused image without using eyeglasses or contact lenses to correct their vision. In some applications, when the interpupillary distance is not correctly set, it can lead to an uncomfortable viewing experience and eye strain. For instance, an incorrect interpupillary distance may induce eye strain, fatigue, headaches and blurry vision. As the real world is seen from the perspective of an individual's interpupillary distance, the correct alignment in a headset is important for matching the ingrained sense of three-dimensional (3D) depth and scale. For example, if the display is not adjusted as per a human IPD, a user may start to feel eyestrain and eventually it becomes hard to see the image correctly (e.g., resulting in double vision). Additionally, if the IPD of a headset is incorrectly set, the scale of the virtual world may appear to be slightly incorrect. Therefore, the IPD may need to be adjusted carefully in order to provide sufficient stereo effect while also maintaining user comfort.

Figure 5:
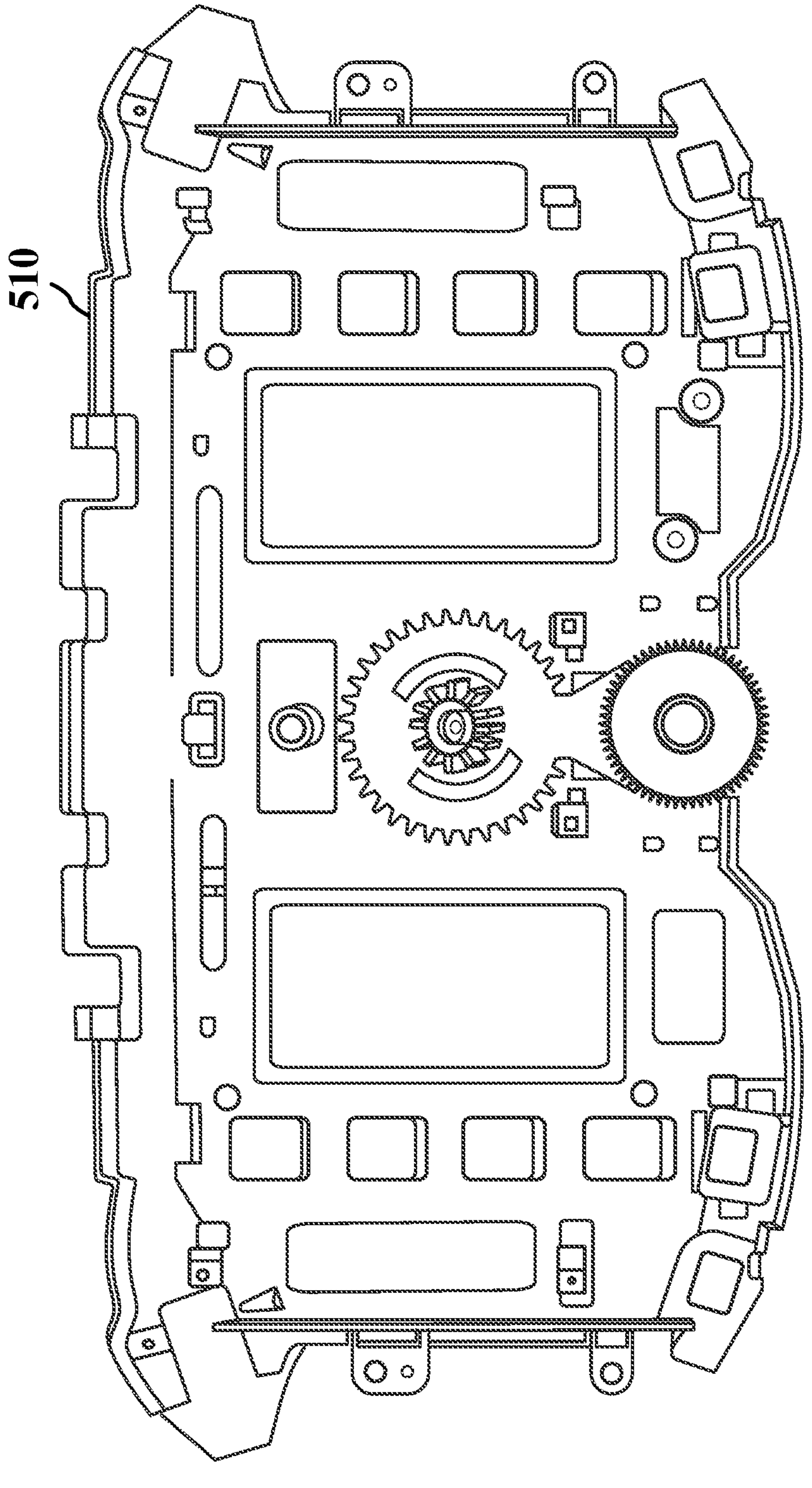
FIG. 5 is a diagram illustrating an example interpupillary distance (IPD) adjustment device.

FIG. 5 is a diagram 500 illustrating an example interpupillary distance adjustment device. More specifically, FIG. 5 depicts an interpupillary distance (IPD) adjustment device that utilizes a rack and pinion mechanism. As shown in FIG. 5, diagram 500 includes an IPD adjustment device 510. As depicted in FIG. 5, the design and manufacture of IPD adjustment device 510 (e.g., a rack and pinon mechanism) may need a large number of components, which will be costly. Further, the design and manufacture of devices such as IPD adjustment device 510 may need a complex assembly process. Additionally, the IPD adjustment device 510 (e.g., a rack and pinon mechanism) may be utilized on head-mounted displays (HMDs) in order to perform interpupillary distance adjustment. A pinion may be rod including a small gear in a pair of meshing gears. However, the design and manufacture of such devices (e.g., IPD adjustment device 510) may be costly, along with increasing the weight of the overall assembly. Also, the design and manufacture of such devices may utilize a complex assembly.

IPD adjustment is a key feature for users in display devices (e.g., extended reality (XR) devices and augmented reality (AR) devices). However, as depicted in FIG. 5, interpupillary distance (IPD) adjustment is a challenging feature on headsets and HMDs. Moreover, IPD adjustment may be challenging in certain types of devices (e.g., XR devices and AR devices). That is, existing IPD adjustment mechanisms may be complex from both a design and an assembly perspective. The manufacturing processes may also need special molding tools and more precision as well, as the components may be small which increases the overall cost for these devices. Further, some of the present IPD adjustment mechanisms may be manual, including complex mechanisms that have more moving parts, which can add more weight and also occupy an increased amount of space. Based on the above, it may be beneficial to utilize a mechanism to adjust the interpupillary distance of a device that is simple to operate. Further, it may be beneficial to utilize a mechanism that uses a reduced amount of space in order to adjust the interpupillary distance of a device, as well as is less expensive to operate.

Aspects of the present disclosure may utilize a mechanism to adjust the interpupillary distance of a device that is simple to operate. Also, aspects presented herein may utilize a mechanism that uses a reduced amount of space in order to adjust the interpupillary distance (IPD) of a device, as well as is less expensive to operate. Aspects presented herein may utilize a screw and nut mechanism for device adjustment at a display device (e.g., a headset or HMD). For instance, aspects presented herein may utilize a screw and nut mechanism for IPD adjustment at a device. Aspects presented herein may utilize an IPD adjustment mechanism using fewer moving parts and occupies less space at a device. In some instances, aspects presented herein may achieve a low play (i.e., the amount of lost motion due to clearance or slackness) between the moving parts of the IPD adjustment mechanism. Accordingly, aspects presented may improve the efficiency of component movement of IPD adjustment mechanisms. Further, aspects presented herein may reduce or eliminate complex components or movements and utilize a simple screw and nut mechanism for IPD adjustment. By doing so, IPD adjustment mechanisms presented herein may make IPD adjustments simple to operate, less expensive to operate, and utilize a reduced amount of space at display devices (e.g., headsets or HMDs).

Aspects presented herein may utilize a screw and nut mechanism for IPD adjustment at a display device. When deployed, the screw and nut mechanism for IPD adjustment may be mounted on the frame of a display device (e.g., a headset or HMD). The screw and nut mechanism for IPD adjustment may also be connected to IPD modules via different mechanical connections, such as link rods. In some aspects, IPD adjustment mechanisms herein may rotate a screw in order to result in a movement of the nut and adjust the IPD. In one example, while rotating the screw, the nut may move up/down and the link rods may expand/contract, which will in turn and push/pull the interpupillary distance in/outward. That is, the distance between the left eye display and the right eye display at a device may increase/decrease depending on the direction of the rotation of the screw. This screw rotation may cause the nut to move up/down and the link rods may expand/contract to adjust the interpupillary distance between the left eye display and the right eye display at a device. In one aspect, rotating the screw in a clockwise fashion may trigger a downward movement of the nut and expand the link rods that increases the interpupillary distance of the display device. In another aspect, rotating the screw in a counterclockwise fashion may trigger an upward movement of the nut and contract the link rods that decreases the interpupillary distance of the display device. The link rods are connecting rods that join and reinforce different parts of the IPD adjustment mechanism. As indicated herein, the expanding/contracting movement of the link rods may result in a corresponding increase/decrease in the interpupillary distance between the left eye display and the right eye display at a device. Additionally, aspects presented herein may utilize a screw and nut mechanism that is mounted on a frame and connected to IPD modules via link rods. In some aspects, while rotating a screw, the nut may move up/down and the link rods may move and push/pull the IPD in an inward/outward direction.

In some aspects, when the screw is rotated at the IPD adjustment mechanism, the circular motion may convert the nut to up/down movement. Also, when the nut is moved up/down, this may result in a corresponding expansion/contraction at the link rods. As indicated above, these link rods may be connected to the left eye display and the right eye display at a device, such that movement of the link rods may result in a corresponding increase/decrease in the interpupillary distance between the left eye display and the right eye display. As such, when the screw rotates, the nut may move in an up/down direction, and then the two link rods may expand/contract based on the movement of the nut. Also, the nut may be connected to the link rods via a pin joint. And these connections and corresponding movements in the screw, nut, and link rods may ultimately make the left eye display and the right eye display move outward and inward to adjust the IPD at the device. That is, the movement of the link rods may result in a corresponding increase/decrease in the interpupillary distance between the left eye display and the right eye display. And so the displays (e.g., the left eye display and the right eye display) can be adjusted according to the user of the display device. Accordingly, the rotational movement of the screw converts to linear motion of the nut, which then converts to rotary motion of the link rods, and then convers to linear motion of the left eye display and the right eye display to increase/decrease the interpupillary distance. Further, a sleeve bearing may be coupled to the screw, which may allow the screw to rotate freely in the clockwise or counterclockwise direction. Also, a set of e-rings may be configured to hold the nut in place with the set of link rods. The set of e-rings may be a type of retaining ring, which may act as a locking device for both the nut and the link rods. Moreover, a guide rod may be configured to limit the movement of the nut to either the upward movement or the downward movement. Additionally, another set of e-rings may be configured to lock the guide rod in place.

Figure 6:
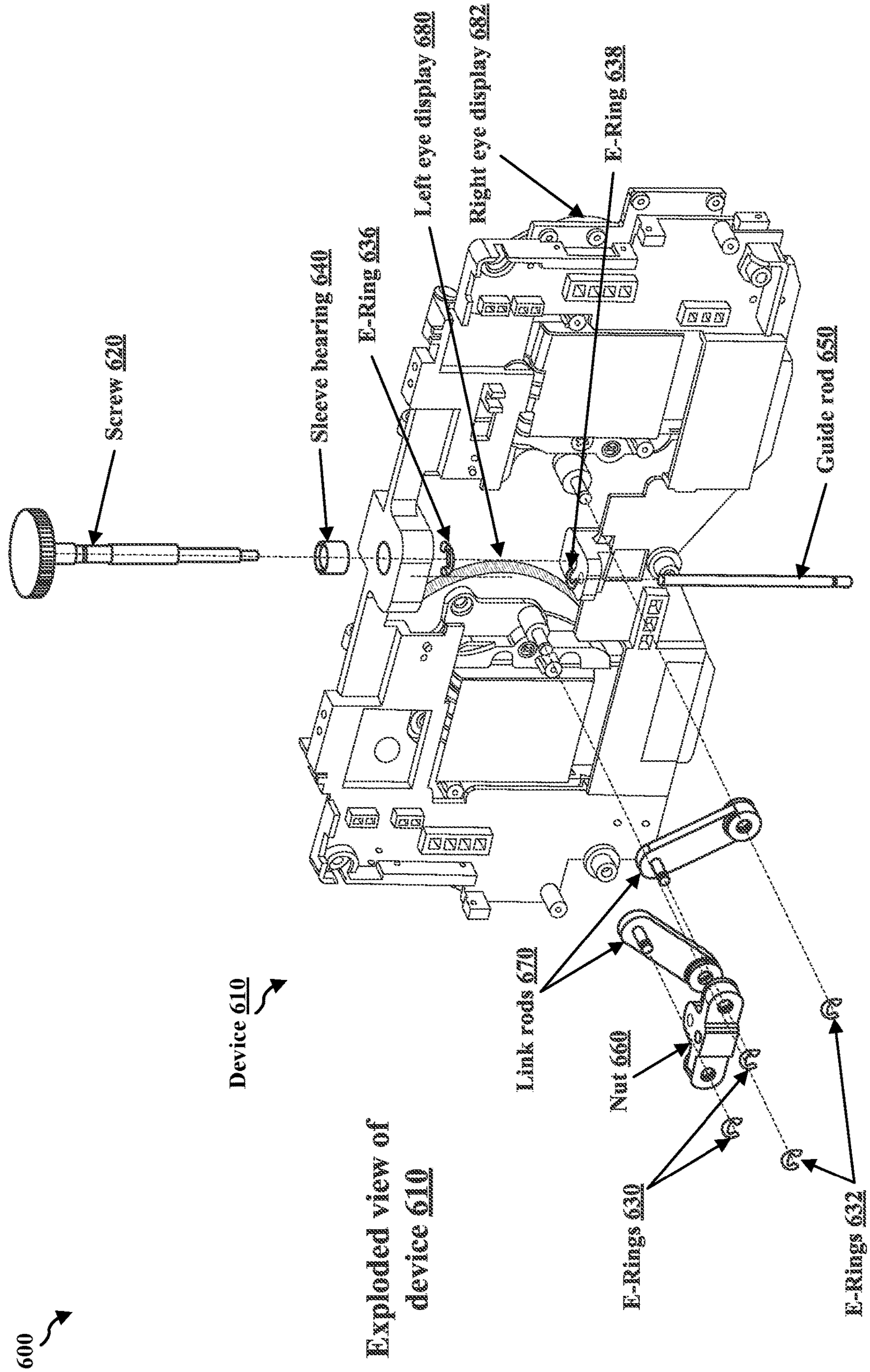
FIG. 6 is a diagram illustrating an example device for IPD adjustment.

FIG. 6 is a diagram 600 illustrating an example device for adjusting a display at a headset or HMD. More specifically, FIG. 6 depicts an example display device for IPD adjustment. As shown in FIG. 6, diagram 600 includes device 610 for IPD adjustment including screw 620 (e.g., an adjustment knob), c-rings 630 (e.g., a set of c-rings, which are a type of retaining ring), c-rings 632, e-ring 636, e-ring 638, sleeve bearing 640 (e.g., a type of bearing that may hold another device or rod in place and allow for rotation), guide rod 650 (e.g., a rod that may limit the movement of a component in one direction or another), nut 660, link rods 670 (e.g., connecting rods that join and reinforce different components), left eye display 680, and right eye display 682. FIG. 6 is an exploded view of device 610. As depicted in FIG. 6, screw 620 may be coupled to the nut 660 and/or link rods 670 may be coupled to the nut 660. Also, guide rod 650 may be coupled to the nut 660 and/or sleeve bearing 640 may be coupled to the screw 620. The e-rings 630, e-rings 632, c-ring 636, and e-ring 638 may be coupled to at least one of the screw 620, the sleeve bearing 640, the guide rod 650, the nut 660, and/or the link rods 670. For instance, e-rings 630 may be coupled to the nut 660 and/or the link rods 670, e-rings 632 may be coupled to the link rods 670, e-ring 636 may be coupled to the screw 620 and the sleeve bearing 640, and e-ring 638 may be coupled to the guide rod 650.

As shown in FIG. 6, screw 620, e-rings 630, e-rings 632, e-ring 636, e-ring 638, sleeve bearing 640, guide rod 650, nut 660, and link rods 670 may each include a specific function in device 610. For example, a rotation of the screw 620 may be configured to trigger a movement of nut 660 (e.g., an upward/downward movement) and the link rods 670. Also, an upward/downward movement of the nut 660 may contract/expand the link rods 670. Further, an expansion/contraction of the link rods 670 may increase/decrease an interpupillary distance between a left eye display 680 and a right eye display 682 at the device 610. Additionally, the guide rod 650 may be configured to limit the movement of the nut 660 to either upward or downward movement. The e-rings 630 and the e-rings 632 may be configured to hold the nut 660 in place with the link rods 670. For instance, e-rings 630 may be configured to lock the nut 660 in place with the link rods 670, e-rings 632 may be configured to lock the link rods 670 with the left eye display 680 and a right eye display 682. The e-ring 636 may be configured to hold/lock the linear movement of the screw 620, and the e-ring 638 may be configured to hold/lock the guide rod 650. The sleeve bearing 640 may be configured to allow the screw 620 to rotate freely in a clockwise or counterclockwise fashion.

As depicted in FIG. 6, device 610 may include a screw 620 that is coupled to the nut 660, as well as link rods 670 that are coupled to the nut 660. The link rods 670 may be configured to adjust a first eye distance of the device 610 (e.g., an IPD of the device 610) based on the first eye distance of the device being inequivalent to a second eye distance of a user of the device, where the first eye distance of the device 610 is a length between a left eye display 680 and a right eye display 682, and where the second eye distance of the user is a length between a left eye of the user and a right eye of the user. The link rods 670 may be configured to adjust the first eye distance of the device 610 (e.g., an IPD of the device 610) until the first eye distance is approximately equivalent to the second eye distance of the user. Also, the first eye distance of the device 610 may be approximately equivalent to the second eye distance of the user if a pupil of the left eye of the user approximately matches a center of the left eye display 680 and a pupil of the right eye of the user approximately matches a center of the right eye display 682. In some instances, the first eye distance of the device 610 may be a length between a center of the left eye display 680 and a center of the right eye display 682, and the second eye distance of the user may be a length between a pupil of the left eye of the user and a pupil of the right eye of the user. Further, the first eye distance of the device 610 may be a first interpupillary distance (IPD), and the second eye distance of the user may be a second IPD.

In some aspects, device 610 may further include the guide rod 650 coupled to the nut 660, the sleeve bearing 640 coupled to the screw 620, and a set of e-rings (e.g., c-rings 630, c-rings 632, c-ring 636, c-ring 638) coupled to at least one of the screw 620, the nut 660, or the link rods 670. In one aspect, an adjustment of the screw 620 may be configured to trigger a movement of the nut 660 and the link rods 670 in order to adjust the first eye distance of the device 610 (e.g., by adjusting the distance between left eye display 680 and right eye display 682). Also, the adjustment of the screw 620 may include a rotation of the screw 620 in a clockwise fashion configured to trigger a downward movement of the nut 660 and expand the link rods 670 that increases the first eye distance of the device 610. Additionally, the guide rod 650 may be configured to limit the movement of the nut 660 to downward movement, the set of e-rings (e.g., c-rings 630, c-rings 632, c-ring 636, c-ring 638) may be configured to hold the nut 660 in place with the link rods 670, and the sleeve bearing 640 may be configured to allow the screw 620 to rotate freely in a clockwise fashion. Further, the adjustment of the screw 620 may include a rotation of the screw 620 in a counterclockwise fashion configured to trigger an upward movement of the nut 660 and contract the link rods 670 that decreases the first eye distance of the device 610. Also, the guide rod 650 may be configured to limit the movement of the nut 660 to upward movement, the set of e-rings (e.g., e-rings 630, e-rings 632, e-ring 636, c-ring 638) may be configured to hold the nut 660 in place with the link rods 670, and the sleeve bearing 640 may be configured to allow the screw 620 to rotate freely in a counterclockwise fashion.

Figure 7:
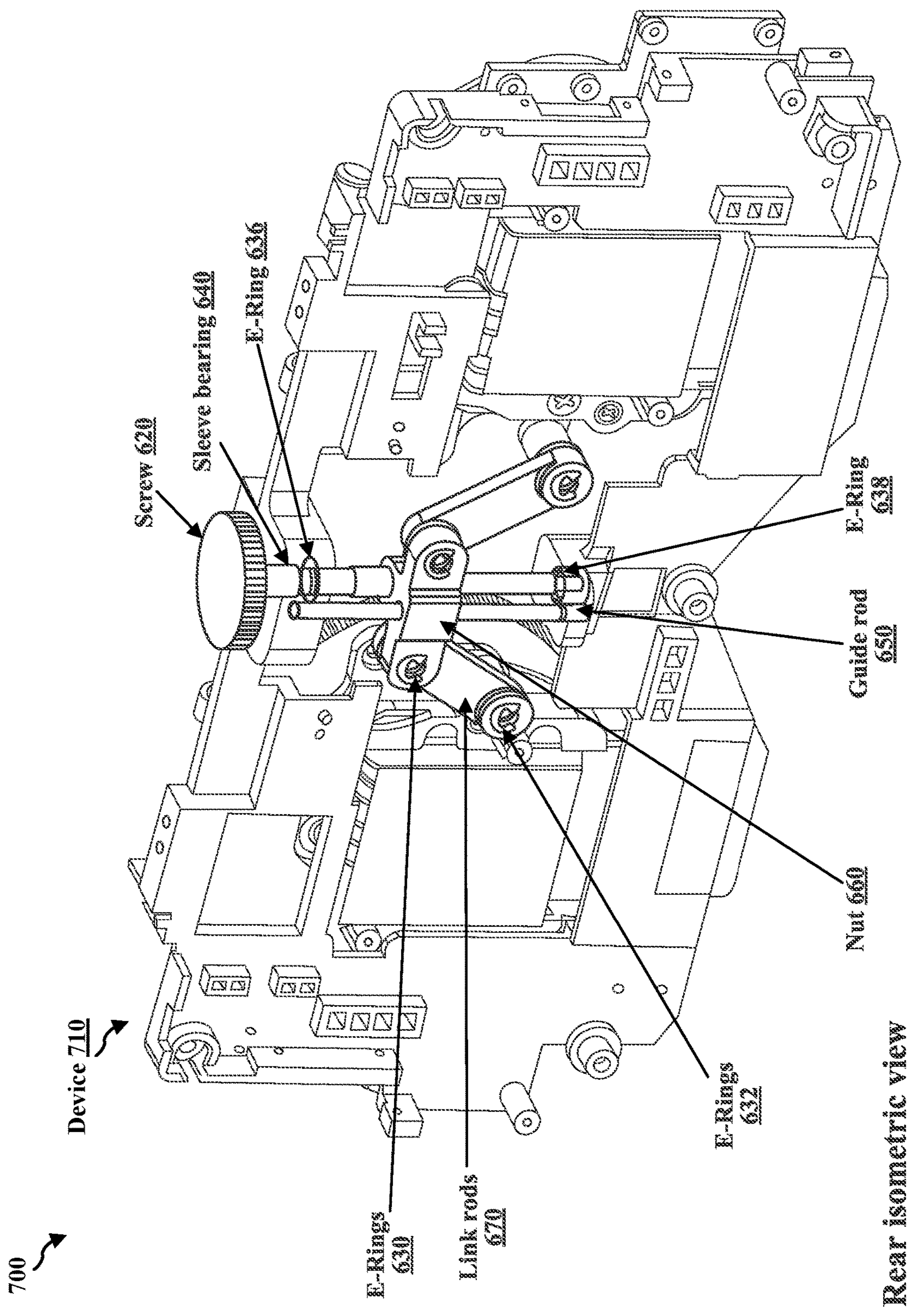
FIG. 7 is a diagram illustrating an example device for IPD adjustment.

FIG. 7 is a diagram 700 illustrating an example device for adjusting a display at a headset or HMD. More specifically, FIG. 7 depicts an example display device for IPD adjustment. Device 710 in FIG. 7 is similar to device 610 in FIG. 6 (e.g., device 710 may include the same components as device 610). As shown in FIG. 7, diagram 700 includes device 710 for IPD adjustment including screw 620 (e.g., an adjustment knob), e-rings 630 (e.g., a set of e-rings, which are a type of retaining ring), e-rings 632, c-ring 636, e-ring 638, sleeve bearing 640 (e.g., a type of bearing that may hold another device or rod in place and allow for rotation), guide rod 650 (e.g., a rod that may limit the movement of a component in one direction or another), nut 660, link rods 670 (e.g., connecting rods that join and reinforce different components), left eye display 680, and right eye display 682. As depicted in FIG. 7, diagram 700 shows that screw 620 may be coupled to the nut 660 and/or link rods 670 may be coupled to the nut 660. Also, as shown in diagram 700, guide rod 650 may be coupled to the nut 660 and/or sleeve bearing 640 may be coupled to the screw 620. As further illustrated in FIG. 7, the e-rings 630, e-rings 632, e-ring 636, and e-ring 638 may be coupled to at least one of the screw 620, the sleeve bearing 640, the guide rod 650, the nut 660, and/or the link rods 670. For instance, e-rings 630 may be coupled to the nut 660 and/or the link rods 670, e-rings 632 may be coupled to the link rods 670, e-ring 636 may be coupled to the screw 620 and the sleeve bearing 640, and e-ring 638 may be coupled to the guide rod 650.

As depicted in FIG. 7, diagram 700 is a rear isometric view of device 710. As shown in FIG. 7, link rods 670 are expanded due to downward movement of the nut 660 and the rotation of screw 620 (e.g., a clockwise rotation). FIG. 7 depicts that all of the components in device 710 (and device 610) are put neatly in place based on the intended function of the device. For instance, screw 620 is coupled to sleeve bearing 640 and nut 660, which is coupled to guide rod 650. In turn, nut 660 is coupled to link rods 670, where the movement of link rods 670 may expand/contract in order to adjust the first eye distance of the device 710 (e.g., by adjusting the distance between left eye display and right eye display (not shown in FIG. 7)).

Figure 8:
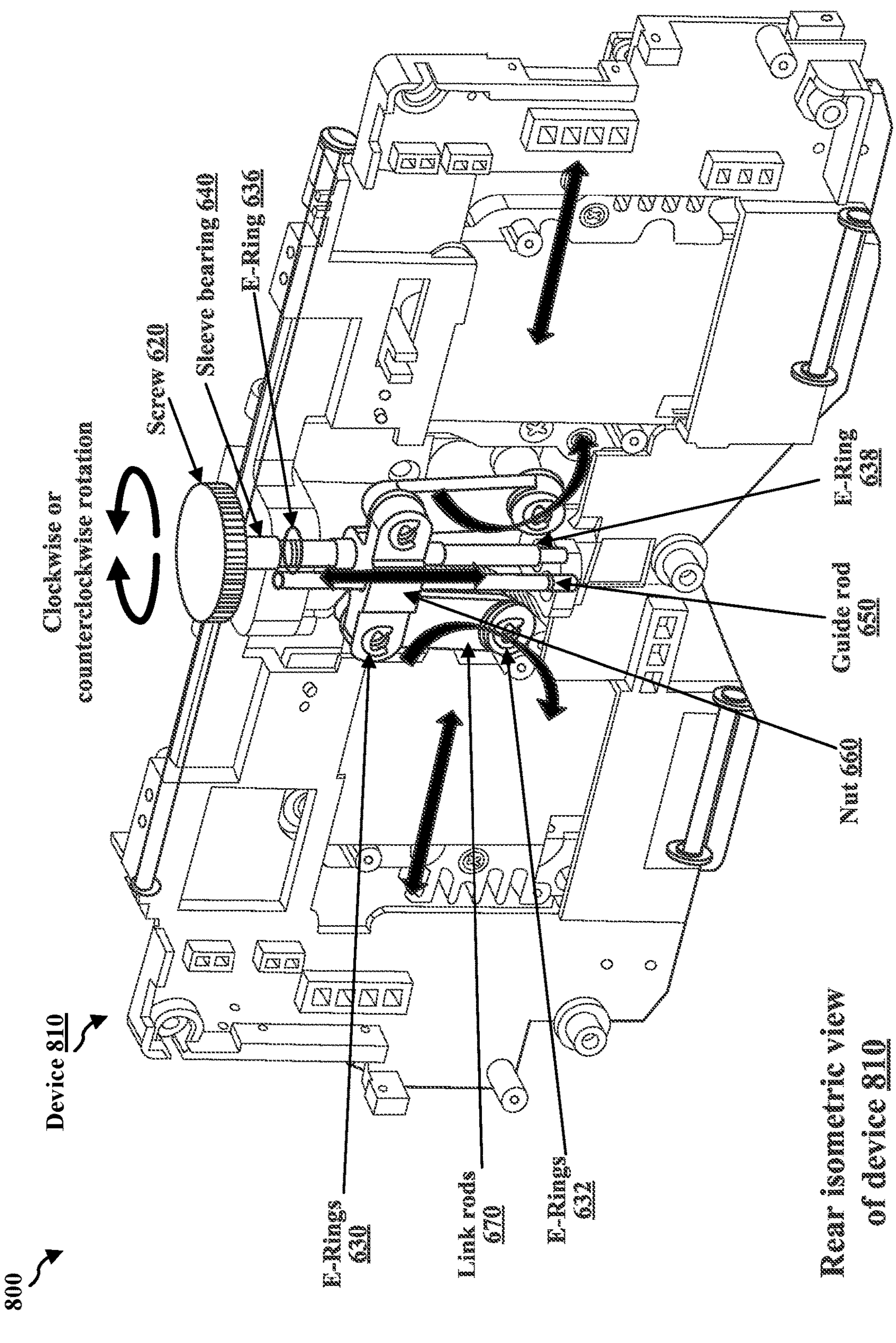
FIG. 8 is a diagram illustrating an example device for IPD adjustment.

FIG. 8 is a diagram 800 illustrating an example device for adjusting a display at a headset or HMD. More specifically, FIG. 8 depicts an example display device for IPD adjustment. Device 810 in FIG. 8 is similar to device 610 in FIG. 6 (e.g., device 810 may include the same components as device 610). As shown in FIG. 8, diagram 800 includes device 810 for IPD adjustment including screw 620 (e.g., an adjustment knob), c-rings 630 (e.g., a set of e-rings, which are a type of retaining ring), e-rings 632, c-ring 636, e-ring 638, sleeve bearing 640 (e.g., a type of bearing that may hold another device or rod in place and allow for rotation), guide rod 650 (e.g., a rod that may limit the movement of a component in one direction or another), nut 660, link rods 670 (e.g., connecting rods that join and reinforce different components), left eye display 680, and right eye display 682. As depicted in FIG. 8, diagram 800 shows that screw 620 may be coupled to the nut 660 and/or link rods 670 may be coupled to the nut 660. Moreover, as shown in diagram 800, guide rod 650 may be coupled to the nut 660 and/or sleeve bearing 640 may be coupled to the screw 620. As further illustrated in FIG. 8, the e-rings 630, e-rings 632, e-ring 636, and e-ring 638 may be coupled to at least one of the screw 620, the sleeve bearing 640, the guide rod 650, the nut 660, and/or the link rods 670. For instance, e-rings 630 may be coupled to the nut 660 and/or the link rods 670, e-rings 632 may be coupled to the link rods 670, c-ring 636 may be coupled to the screw 620 and the sleeve bearing 640, and e-ring 638 may be coupled to the guide rod 650.

As depicted in FIG. 8, diagram 800 is a rear isometric view of device 810. As shown in FIG. 8, link rods 670 may be contracted due to upward movement of the nut 660 and the rotation of screw 620 (e.g., a counterclockwise rotation). FIG. 8 depicts the movement of all of the components in device 810 (and device 610). For instance, screw 620 may be rotated in a clockwise fashion or a counterclockwise fashion, and nut 660 may move in a corresponding upward direction or a corresponding downward direction. In one aspect, a clockwise rotation of the screw 620 may cause a downward movement of the nut 660. In another aspect, a counterclockwise rotation of the screw 620 may cause an upward movement of the nut 660. Nut 660 may be coupled to link rods 670, where a downward movement by nut 660 may cause link rods 670 to expand, which in turn increases the first eye distance (e.g., IPD) of the device 810 (e.g., by increasing the distance between left eye display 680 and right eye display 682 (not shown in FIG. 8)). Likewise, an upward movement by nut 660 may cause link rods 670 to contract, which in turn decreases the first eye distance (e.g., IPD) of the device 810 (e.g., by decreasing the distance between left eye display 680 and right eye display 682 (not shown in FIG. 8)). As mentioned herein, a user of the device 810 (or device 610, device 710, or device 910 below) may rotate the screw in a clockwise fashion based on a desire to increase the IPD at the device. Likewise, a user of the device 810 (or device 610, device 710, or device 910 below) may rotate the screw in a counterclockwise fashion based on a desire to decrease the IPD at the device.

Figure 9:
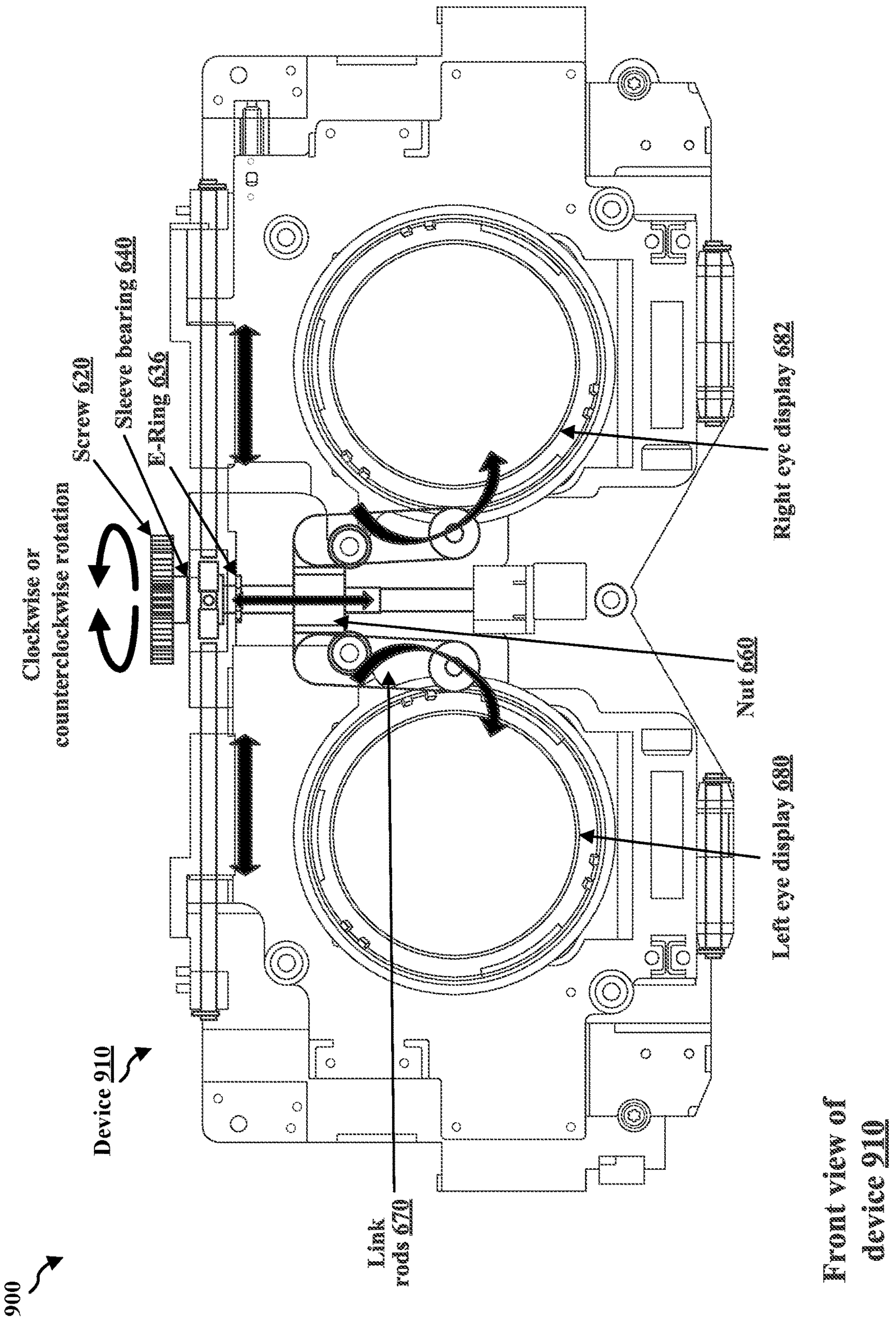
FIG. 9 is a diagram illustrating example device for IPD adjustment.

FIG. 9 is a diagram 900 illustrating an example device for adjusting a display at a headset or HMD. More specifically, FIG. 9 depicts an example display device for IPD adjustment. Device 910 in FIG. 9 is similar to device 610 in FIG. 6 (e.g., device 910 may include the same components as device 610). As shown in FIG. 9, diagram 900 includes device 910 for IPD adjustment including screw 620 (e.g., an adjustment knob), e-rings 630 (e.g., a set of e-rings, which are a type of retaining ring), e-rings 632, e-ring 636, e-ring 638, sleeve bearing 640 (e.g., a type of bearing that may hold another device or rod in place and allow for rotation), guide rod 650 (e.g., a rod that may limit the movement of a component in one direction or another), nut 660, link rods 670 (e.g., connecting rods that join and reinforce different components), left eye display 680, and right eye display 682. As depicted in FIG. 9, diagram 900 shows that screw 620 may be coupled to the nut 660 and/or link rods 670 may be coupled to the nut 660. Further, as shown in diagram 900, guide rod 650 may be coupled to the nut 660 and/or sleeve bearing 640 may be coupled to the screw 620. As further illustrated in FIG. 9, the e-rings 630, e-rings 632, e-ring 636, and e-ring 638 may be coupled to at least one of the screw 620, the sleeve bearing 640, the guide rod 650, the nut 660, and/or the link rods 670. For instance, e-rings 630 may be coupled to the nut 660 and/or the link rods 670, e-rings 632 may be coupled to the link rods 670, e-ring 636 may be coupled to the screw 620 and the sleeve bearing 640, and e-ring 638 may be coupled to the guide rod 650.

As depicted in FIG. 9, diagram 900 is a front view of device 910. As shown in FIG. 9, link rods 670 are contracted due to upward movement of the nut 660 and the rotation of screw 620 (e.g., a counterclockwise rotation). Like FIG. 8, FIG. 9 depicts the movement of all of the components in device 910 (and device 610). For instance, screw 620 may be rotated in a clockwise fashion or a counterclockwise fashion, and nut 660 may move in an upward direction or a downward direction. In one aspect, a clockwise rotation of the screw 620 may cause a downward movement of the nut 660. In another aspect, a counterclockwise rotation of the screw 620 may cause an upward movement of the nut 660. Nut 660 may be coupled to link rods 670, where a downward movement by nut 660 may cause link rods 670 to expand, which in turn increases the first eye distance (e.g., IPD) of the device 910 (e.g., by increasing the distance between left eye display 680 and right eye display 682 (shown in FIG. 9)). Likewise, an upward movement by nut 660 may cause link rods 670 to contract, which in turn decreases the first eye distance (e.g., IPD) of the device 910 (e.g., by decreasing the distance between left eye display 680 and right eye display 682).

Figure 10:
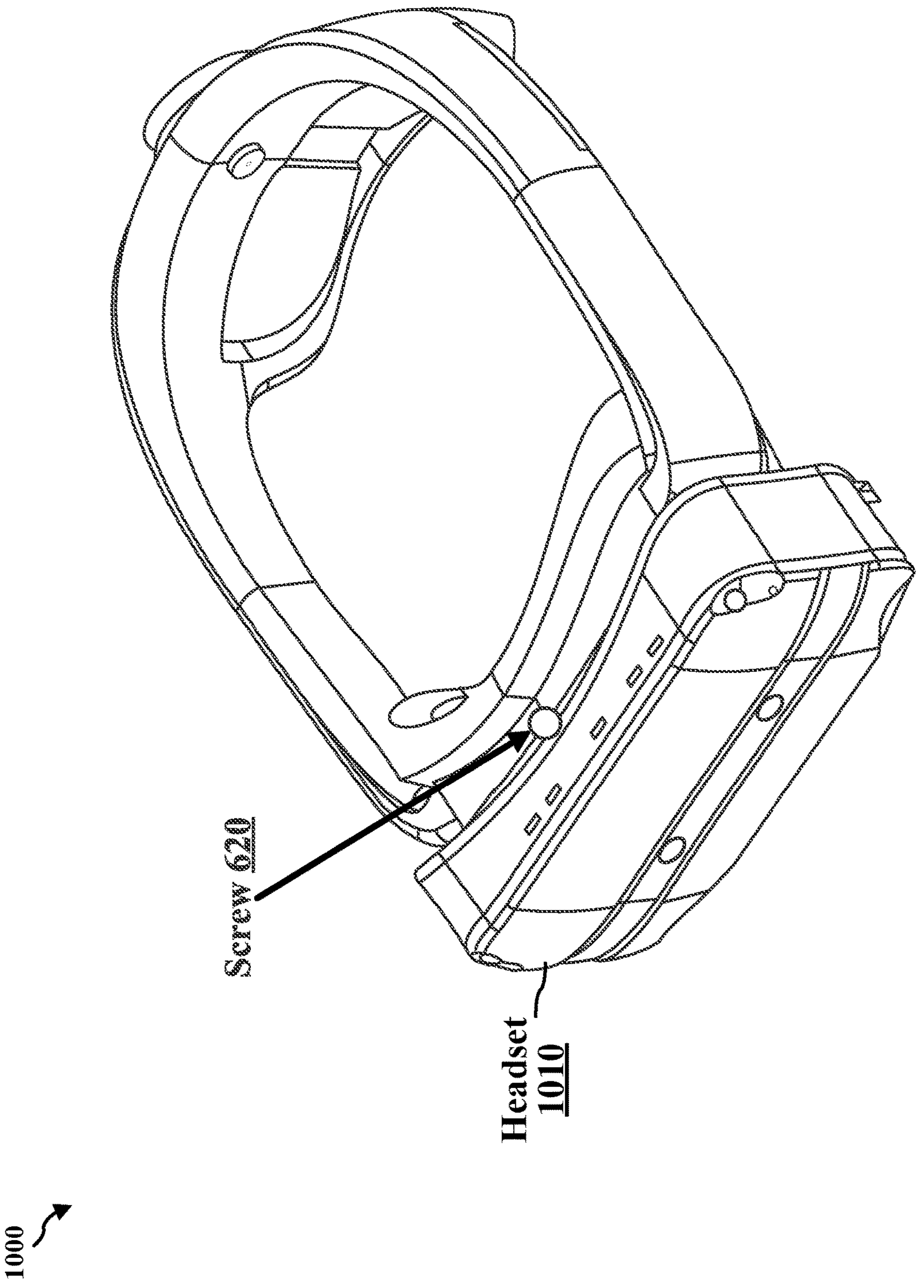
FIG. 10 is a diagram illustrating an example device for IPD adjustment at a headset.

FIG. 10 is a diagram 1000 illustrating an example device for adjusting the display at a headset or HMD. More specifically, FIG. 10 depicts an example display device for IPD adjustment at a headset 1010 (e.g., a headset or HMD). Headset 1010 in FIG. 10 is similar to device 610 in FIG. 6 (e.g., headset 1010 may include the same components as device 610). As shown in FIG. 10, diagram 1000 includes headset 1010 including screw 620 (e.g., an adjustment knob). Headset 1010 also includes a number of components that are not shown in FIG. 10: e-rings, a sleeve bearing, a guide rod, a nut, link rods, a left eye display, and/or a right eye display. As depicted in FIG. 10, diagram 1000 shows that headset 1010 may include the aforementioned components for IPD adjustment, such as screw 620, as well as all of the aforementioned components that are not shown in FIG. 10. Indeed, device 610 and all of its corresponding components may be included in headset 1010 in FIG. 10. FIG. 10 depicts that device 610 may be used in conjunction with headset 1010 or another similar device (e.g., a headset or HMD).

Aspects presented herein may include a number of benefits or advantages. For instance, aspects presented herein may utilize a screw and nut mechanism for IPD adjustment. In turn, this may reduce the amount of cost by reducing the manufacturing cost for the mechanism. Also, aspects presented herein may utilize a reduced number of components for the IPD adjustment. Aspects presented herein may also reduce or eliminate the amount of play (i.e., the amount of lost motion due to clearance or slackness) between moving parts. Further, aspects presented herein may allow for a controlled translation of IPD adjustment. Aspects presents herein may also include robust IPD adjustment mechanisms that include a higher amount of load. Moreover, IPD adjustment mechanisms herein may utilize a reduced amount of space in the display device, utilize a reduced amount of effort to operate to mechanism, as well as be easy to assemble.

Figure 11:
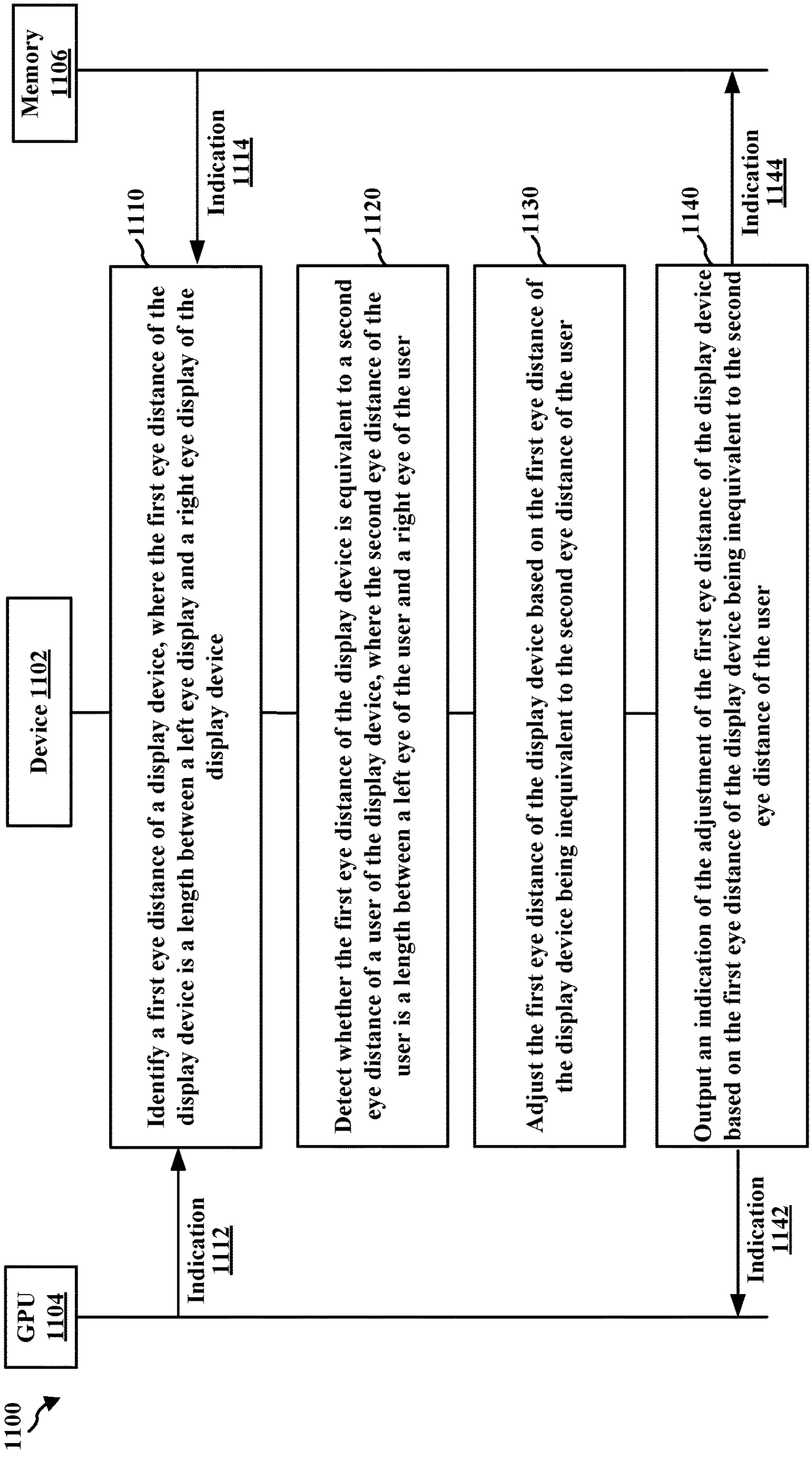
FIG. 11 is a communication flow diagram illustrating example communications between a device, a GPU, and a memory.

FIG. 11 is a communication flow diagram 1100 of device adjustment in accordance with one or more techniques of this disclosure. As shown in FIG. 11, diagram 1100 includes example communications between a device 1102 (e.g., a device for IPD adjustment), a GPU 1104 (e.g., a GPU, a GPU component, another graphics processor, a CPU, a CPU component, or another central processor), and memory 1106 (e.g., a system memory, a graphics memory, or a memory or cache at a GPU), in accordance with one or more techniques of this disclosure.

At 1110, device 1102 may identify a first eye distance of a display device, where the first eye distance of the display device is a length between a left eye display and a right eye display of the display device. In some aspects, the device may perform the identification based on receiving an indication or retrieving an indication. That is, identifying a first eye distance of a display device may include receiving an indication of a first eye distance of a display device. For example, device 1102 may receive an indication of a first eye distance of a display device (e.g., receive indication 1112 from GPU 1104). Also, identifying a first eye distance of a display device may include retrieving, from a memory or cache, an indication of a first eye distance of a display device and/or retrieving. For example, device 1102 may retrieve an indication of a first eye distance of a display device (e.g., retrieve indication 1114 from memory 1106).

At 1120, device 1102 may detect whether the first eye distance of the display device is equivalent to a second eye distance of a user of the display device, where the second eye distance of the user is a length between a left eye of the user and a right eye of the user.

At 1130, device 1102 may adjust the first eye distance of the display device based on the first eye distance of the display device being inequivalent to the second eye distance of the user. In some aspects, adjusting the first eye distance of the display device may include: adjusting the first eye distance of the display device until the first eye distance of the display device is approximately equivalent to the second eye distance of the user. The first eye distance of the display device may be approximately equivalent to the second eye distance of the user if a pupil of the left eye of the user approximately matches a center of the left eye display and a pupil of the right eye of the user approximately matches a center of the right eye display. In some instances, the first eye distance of the display device may be a length between a center of the left eye display and a center of the right eye display, the second eye distance of the user may be a length between a pupil of the left eye of the user and a pupil of the right eye of the user, the first eye distance of the display device may be a first interpupillary distance (IPD), and/or the second eye distance of the user may be a second IPD.

In some aspects, the display device may include at least one of: a screw, a guide rod, a set of link rods, at least one nut, a set of e-rings, or a sleeve bearing. Also, adjusting the first eye distance of the display device may include adjusting the first eye distance of the display device with at least one of: the screw, the guide rod, the set of link rods, the at least one nut, the set of e-rings, or the sleeve bearing. Further, adjusting the first eye distance of the display device may include adjusting the screw in order trigger a movement of the at least one nut and the set of link rods that adjusts the first eye distance of the display device. Adjusting the screw in order trigger the movement of the at least one nut and the set of link rods may include rotating the screw in a clockwise fashion in order trigger a downward movement of the at least one nut and expand the set of link rods that increases the first eye distance of the display device. Moreover, the guide rod may be configured to limit the movement of the at least one nut to the downward movement, the set of e-rings may be configured to hold the at least one nut in place with the set of link rods, and the sleeve bearing may be configured to allow the screw to rotate freely in the clockwise fashion. In some aspects, adjusting the screw in order trigger the movement of the at least one nut and the set of link rods may include rotating the screw in a counterclockwise fashion in order trigger an upward movement of the at least one nut and contract the set of link rods that decreases the first eye distance of the display device. Also, the guide rod may be configured to limit the movement of the at least one nut to the upward movement, the set of e-rings may be configured to hold the at least one nut in place with the set of link rods, and the sleeve bearing may be configured to allow the screw to rotate freely in the counterclockwise fashion.

At 1140, device 1102 may output an indication of the adjustment of the first eye distance of the display device based on the first eye distance of the display device being inequivalent to the second eye distance of the user. In some instances, outputting the indication of the adjustment of the first eye distance of the display device may include transmitting the indication of the adjustment of the first eye distance. For example, device 1102 may transmit the indication of the adjustment of the first eye distance (e.g., transmit indication 1142 to GPU 1104). Also, outputting the indication of the adjustment of the first eye distance of the display device may include storing the indication of the adjustment of the first eye distance. For example, device 1102 may store the indication of the adjustment of the first eye distance (e.g., store indication 1144 in memory 1106).

Figure 12:
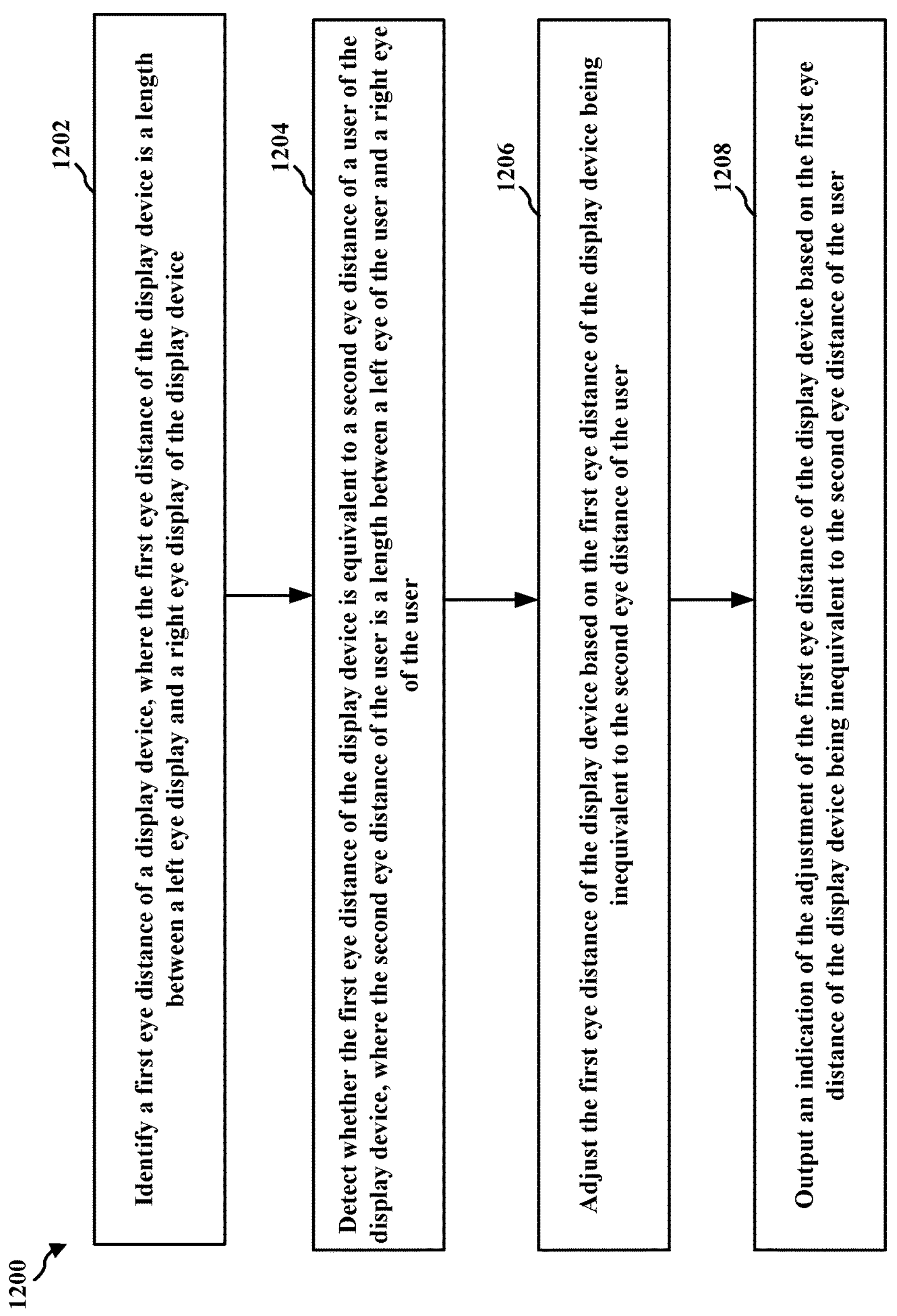
FIG. 12 is a flowchart of an example method of device adjustment.

FIG. 12 is a flowchart 1200 of an example method of device adjustment in accordance with one or more techniques of this disclosure. The method may be performed by a device (e.g., a device for IPD adjustment), a GPU (e.g., a GPU, a GPU component, another graphics processor, a CPU, a CPU component, or another central processor), a CPU (a CPU, a CPU component, another central processor, a GPU, a GPU component, or another graphics processor), a display driver integrated circuit (DDIC), an apparatus for device adjustment, a wireless communication device, and/or any apparatus that may perform device adjustment as used in connection with the examples of FIGS. 1-11.

At 1202, the device may identify a first eye distance of a display device, where the first eye distance of the display device is a length between a left eye display and a right eye display of the display device, as described in connection with the examples in FIGS. 1-11. For example, as described in 1110 of FIG. 11, device 1102 may identify a first eye distance of a display device, where the first eye distance of the display device is a length between a left eye display and a right eye display of the display device. Further, step 1202 may be performed by display processor 127 in FIG. 1. In some aspects, the device may perform the identification based on receiving an indication or retrieving an indication. That is, identifying a first eye distance of a display device may include receiving an indication of a first eye distance of a display device. For example, the device may receive an indication of a first eye distance of a display device. Also, identifying a first eye distance of a display device may include retrieving, from a memory or cache, an indication of a first eye distance of a display device and/or retrieving. For example, the device may retrieve an indication of a first eye distance of a display device.

At 1204, the device may detect whether the first eye distance of the display device is equivalent to a second eye distance of a user of the display device, where the second eye distance of the user is a length between a left eye of the user and a right eye of the user, as described in connection with the examples in FIGS. 1-11. For example, as described in 1120 of FIG. 11, device 1102 may detect whether the first eye distance of the display device is equivalent to a second eye distance of a user of the display device, where the second eye distance of the user is a length between a left eye of the user and a right eye of the user. Further, step 1204 may be performed by display processor 127 in FIG. 1.

At 1206, the device may adjust the first eye distance of the display device based on the first eye distance of the display device being inequivalent to the second eye distance of the user, as described in connection with the examples in FIGS. 1-11. For example, as described in 1130 of FIG. 11, device 1102 may adjust the first eye distance of the display device based on the first eye distance of the display device being inequivalent to the second eye distance of the user. Further, step 1206 may be performed by display processor 127 in FIG. 1. In some aspects, adjusting the first eye distance of the display device may include: adjusting the first eye distance of the display device until the first eye distance of the display device is approximately equivalent to the second eye distance of the user. The first eye distance of the display device may be approximately equivalent to the second eye distance of the user if a pupil of the left eye of the user approximately matches a center of the left eye display and a pupil of the right eye of the user approximately matches a center of the right eye display. In some instances, the first eye distance of the display device may be a length between a center of the left eye display and a center of the right eye display, the second eye distance of the user may be a length between a pupil of the left eye of the user and a pupil of the right eye of the user, the first eye distance of the display device may be a first interpupillary distance (IPD), and/or the second eye distance of the user may be a second IPD.

In some aspects, the display device may include at least one of: a screw, a guide rod, a set of link rods, at least one nut, a set of e-rings, or a sleeve bearing. Also, adjusting the first eye distance of the display device may include adjusting the first eye distance of the display device with at least one of: the screw, the guide rod, the set of link rods, the at least one nut, the set of e-rings, or the sleeve bearing. Further, adjusting the first eye distance of the display device may include adjusting the screw in order trigger a movement of the at least one nut and the set of link rods that adjusts the first eye distance of the display device. Adjusting the screw in order trigger the movement of the at least one nut and the set of link rods may include rotating the screw in a clockwise fashion in order trigger a downward movement of the at least one nut and expand the set of link rods that increases the first eye distance of the display device. Moreover, the guide rod may be configured to limit the movement of the at least one nut to the downward movement, the set of e-rings may be configured to hold the at least one nut in place with the set of link rods, and the sleeve bearing may be configured to allow the screw to rotate freely in the clockwise fashion. In some aspects, adjusting the screw in order trigger the movement of the at least one nut and the set of link rods may include rotating the screw in a counterclockwise fashion in order trigger an upward movement of the at least one nut and contract the set of link rods that decreases the first eye distance of the display device. Also, the guide rod may be configured to limit the movement of the at least one nut to the upward movement, the set of e-rings may be configured to hold the at least one nut in place with the set of link rods, and the sleeve bearing may be configured to allow the screw to rotate freely in the counterclockwise fashion.

At 1208, the device may output an indication of the adjustment of the first eye distance of the display device based on the first eye distance of the display device being inequivalent to the second eye distance of the user, as described in connection with the examples in FIGS. 1-11. For example, as described in 1140 of FIG. 11, device 1102 may output an indication of the adjustment of the first eye distance of the display device based on the first eye distance of the display device being inequivalent to the second eye distance of the user. Further, step 1208 may be performed by display processor 127 in FIG. 1. In some instances, outputting the indication of the adjustment of the first eye distance of the display device may include transmitting the indication of the adjustment of the first eye distance. For example, the device may transmit the indication of the adjustment of the first eye distance. Also, outputting the indication of the adjustment of the first eye distance of the display device may include storing the indication of the adjustment of the first eye distance. For example, the device may store the indication of the adjustment of the first eye distance.

In configurations, a method or an apparatus for device adjustment is provided. The apparatus may be a device (e.g., a device for IPD adjustment), a GPU (or other graphics processor), a CPU (or other central processor), a DDIC, an apparatus for device adjustment, and/or some other processor that may perform device adjustment. In aspects, the apparatus may be the display processor 127 within the device 104, or may be some other hardware within the device 104 or another device. The apparatus, e.g., display processor 127, may include means for identifying a first eye distance of a display device, where the first eye distance of the display device is a length between a left eye display and a right eye display of the display device. The apparatus, e.g., display processor 127, may also include means for detecting whether the first eye distance of the display device is equivalent to a second eye distance of a user of the display device, where the second eye distance of the user is a length between a left eye of the user and a right eye of the user. The apparatus, e.g., display processor 127, may also include means for adjusting the first eye distance of the display device based on the first eye distance of the display device being inequivalent to the second eye distance of the user. The apparatus, e.g., display processor 127, may also include means for outputting an indication of the adjustment of the first eye distance of the display device based on the first eye distance of the display device being inequivalent to the second eye distance of the user.

The subject matter described herein may be implemented to realize one or more benefits or advantages. For instance, the described device adjustment techniques may be used by a device, a GPU, a CPU, a central processor, or some other processor that may perform device adjustment to implement the IPD adjustment techniques described herein. This may also be accomplished at a low cost compared to other device adjustment techniques. Moreover, the device adjustment techniques herein may improve or speed up data processing or execution. Further, the device adjustment techniques herein may improve resource or data utilization and/or resource efficiency. Additionally, aspects of the present disclosure may utilize IPD adjustment techniques in order to improve memory bandwidth efficiency and/or increase processing speed at a GPU, a CPU, or a DPU.

It is understood that the specific order or hierarchy of blocks in the processes/flowcharts disclosed is an illustration of example approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects.

Unless specifically stated otherwise, the term "some" refers to one or more and the term "or" may be interpreted as "and/or" where context does not dictate otherwise. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only. B only, C only, A and B. A and C. B and C. or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

In one or more examples, the functions described herein may be implemented in hardware, software, firmware, or any combination thereof. For example, although the term "processing unit" has been used throughout this disclosure, such processing units may be implemented in hardware, software, firmware, or any combination thereof. If any function, processing unit, technique described herein, or other module is implemented in software, the function, processing unit, technique described herein, or other module may be stored on or transmitted over as one or more instructions or code on a computer-readable medium.

In accordance with this disclosure, the term "or" may be interpreted as "and/or" where context does not dictate otherwise. Additionally, while phrases such as "one or more" or "at least one" or the like may have been used for some features disclosed herein but not others, the features for which such language was not used may be interpreted to have such a meaning implied where context does not dictate otherwise.

In one or more examples, the functions described herein may be implemented in hardware, software, firmware, or any combination thereof. For example, although the term "processing unit" has been used throughout this disclosure, such processing units may be implemented in hardware, software, firmware, or any combination thereof. If any function, processing unit, technique described herein, or other module is implemented in software, the function, processing unit, technique described herein, or other module may be stored on or transmitted over as one or more instructions or code on a computer-readable medium. Computer-readable media may include computer data storage media or communication media including any medium that facilitates transfer of a computer program from one place to another. In this manner, computer-readable media generally may correspond to (1) tangible computer-readable storage media, which is non-transitory or (2) a communication medium such as a signal or carrier wave. Data storage media may be any available media that may be accessed by one or more computers or one or more processors to retrieve instructions, code and/or data structures for implementation of the techniques described in this disclosure. By way of example, and not limitation, such computer-readable media may comprise RAM, ROM, EEPROM, CD-ROM or other optical disk storage, magnetic disk storage or other magnetic storage devices. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media. A computer program product may include a computer-readable medium.

The code may be executed by one or more processors, such as one or more digital signal processors (DSPs), general purpose microprocessors, application specific integrated circuits (ASICs), arithmetic logic units (ALUs), field programmable logic arrays (FPGAs), or other equivalent integrated or discrete logic circuitry. Accordingly, the term "processor," as used herein may refer to any of the foregoing structure or any other structure suitable for implementation of the techniques described herein. Also, the techniques could be fully implemented in one or more circuits or logic elements.

The techniques of this disclosure may be implemented in a wide variety of devices or apparatuses, including a wireless handset, an integrated circuit (IC) or a set of ICs, e.g., a chip set. Various components, modules or units are described in this disclosure to emphasize functional aspects of devices configured to perform the disclosed techniques, but do not necessarily need realization by different hardware units. Rather, as described above, various units may be combined in any hardware unit or provided by a collection of inter-operative hardware units, including one or more processors as described above, in conjunction with suitable software and/or firmware. Accordingly, the term "processor," as used herein may refer to any of the foregoing structure or any other structure suitable for implementation of the techniques described herein. Also, the techniques may be fully implemented in one or more circuits or logic elements.

The following aspects are illustrative only and may be combined with other aspects or teachings described herein, without limitation.

Aspect 1 is an apparatus for device adjustment, including (i.e., comprising) at least one memory and at least one processor coupled to the at least one memory and, based at least in part on information stored in the at least one memory, the at least one processor, individually or in any combination, is configured to: identify a first eye distance of a display device, wherein the first eye distance of the display device is a length between a left eye display and a right eye display of the display device; detect whether the first eye distance of the display device is equivalent to a second eye distance of a user of the display device, wherein the second eye distance of the user is a length between a left eye of the user and a right eye of the user; and adjust the first eye distance of the display device based on the first eye distance of the display device being inequivalent to the second eye distance of the user.

Aspect 2 is the apparatus of aspect 1, wherein to adjust the first eye distance of the display device, the at least one processor is configured to: adjust the first eye distance of the display device until the first eye distance of the display device is approximately equivalent to the second eye distance of the user.

Aspect 3 is the apparatus of aspect 2, wherein the first eye distance of the display device is approximately equivalent to the second eye distance of the user if a pupil of the left eye of the user approximately matches a center of the left eye display and a pupil of the right eye of the user approximately matches a center of the right eye display.

Aspect 4 is the apparatus of any of aspects 1 to 3, wherein the display device comprises at least one of: a screw, a guide rod, a set of link rods, at least one nut, a set of e-rings, or a sleeve bearing, and wherein to adjust the first eye distance of the display device, the at least one processor is configured to: adjust the first eye distance of the display device with at least one of: the screw, the guide rod, the set of link rods, the at least one nut, the set of e-rings, or the sleeve bearing.

Aspect 5 is the apparatus of aspect 4, wherein to adjust the first eye distance of the display device, the at least one processor is configured to: adjust the screw in order trigger a movement of the at least one nut and the set of link rods that adjusts the first eye distance of the display device.

Aspect 6 is the apparatus of aspect 5, wherein to adjust the screw in order trigger the movement of the at least one nut and the set of link rods, the at least one processor is configured to: rotate the screw in a clockwise fashion in order trigger a downward movement of the at least one nut and expand the set of link rods that increases the first eye distance of the display device.

Aspect 7 is the apparatus of aspect 6, wherein the guide rod is configured to limit the movement of the at least one nut to the downward movement, wherein the set of e-rings is configured to hold the at least one nut in place with the set of link rods, and wherein the sleeve bearing is configured to allow the screw to rotate freely in the clockwise fashion.

Aspect 8 is the apparatus of any of aspects 5 to 7, wherein to adjust the screw in order trigger the movement of the at least one nut and the set of link rods, the at least one processor is configured to: rotate the screw in a counterclockwise fashion in order trigger an upward movement of the at least one nut and contract the set of link rods that decreases the first eye distance of the display device.

Aspect 9 is the apparatus of aspect 8, wherein the guide rod is configured to limit the movement of the at least one nut to the upward movement, wherein the set of e-rings is configured to hold the at least one nut in place with the set of link rods, and wherein the sleeve bearing is configured to allow the screw to rotate freely in the counterclockwise fashion.

Aspect 10 is the apparatus of any of aspects 1 to 9, wherein the first eye distance of the display device is a length between a center of the left eye display and a center of the right eye display, wherein the second eye distance of the user is a length between a pupil of the left eye of the user and a pupil of the right eye of the user, wherein the first eye distance of the display device is a first interpupillary distance (IPD), and wherein the second eye distance of the user is a second IPD.

Aspect 11 is the apparatus of any of aspects 1 to 10, wherein the at least one processor is configured to: output an indication of the adjustment of the first eye distance of the display device based on the first eye distance of the display device being inequivalent to the second eye distance of the user.

Aspect 12 is the apparatus of aspect 11, wherein the apparatus is a wireless communication device further including (i.e., comprising): a transceiver coupled to the at least one processor, wherein to output the indication of the adjustment, the at least one processor is configured to output, via the transceiver, the indication of the adjustment.

Aspect 13 is a method of device adjustment for implementing any of aspects 1 to 12.

Aspect 14 is an apparatus for device adjustment including means for implementing any of aspects 1 to 12.

Aspect 15 is a computer-readable medium (e.g., a non-transitory computer-readable medium) storing computer executable code, the code when executed by at least one processor causes the at least one processor to implement any of aspects 1 to 12.

Aspect 16 is a device, comprising: a screw coupled to at least one nut; and a set of link rods coupled to the at least one nut; wherein the set of link rods is configured to adjust a first eye distance of the device based on the first eye distance of the device being inequivalent to a second eye distance of a user of the device, wherein the first eye distance of the device is a length between a left eye display and a right eye display of the device, and wherein the second eye distance of the user is a length between a left eye of the user and a right eye of the user.

Aspect 17 is the apparatus of aspect 16, wherein the set of link rods is configured to adjust the first eye distance of the device until the first eye distance of the device is approximately equivalent to the second eye distance of the user.

Aspect 18 is the apparatus of aspect 17, wherein the first eye distance of the device is approximately equivalent to the second eye distance of the user if a pupil of the left eye of the user approximately matches a center of the left eye display and a pupil of the right eye of the user approximately matches a center of the right eye display.

Aspect 19 is the apparatus of any of aspects 16 to 18, further comprising: a guide rod coupled to the at least one nut; a set of e-rings coupled to at least one of the screw, the at least one nut, or the set of link rods; and a sleeve bearing coupled to the screw.

Aspect 20 is the apparatus of aspect 19, wherein an adjustment of the screw is configured to trigger a movement of the at least one nut and the set of link rods in order to adjust the first eye distance of the device.

Aspect 21 is the apparatus of aspect 20, wherein the adjustment of the screw comprises: a rotation of the screw in a clockwise fashion configured to trigger a downward movement of the at least one nut and expand the set of link rods that increases the first eye distance of the device.

Aspect 22 is the apparatus of aspect 21, wherein the guide rod is configured to limit the movement of the at least one nut to the downward movement, wherein the set of e-rings is configured to hold the at least one nut in place with the set of link rods, and wherein the sleeve bearing is configured to allow the screw to rotate freely in the clockwise fashion.

Aspect 23 is the apparatus of any of aspects 20 to 22, wherein the adjustment of the screw comprises: a rotation of the screw in a counterclockwise fashion configured to trigger an upward movement of the at least one nut and contract the set of link rods that decreases the first eye distance of the device.

Aspect 24 is the apparatus of aspect 23, wherein the guide rod is configured to limit the movement of the at least one nut to the upward movement, wherein the set of e-rings is configured to hold the at least one nut in place with the set of link rods, and wherein the sleeve bearing is configured to allow the screw to rotate freely in the counterclockwise fashion.

Aspect 25 is the apparatus of any of aspects 16 to 24, wherein the first eye distance of the device is a length between a center of the left eye display and a center of the right eye display, wherein the second eye distance of the user is a length between a pupil of the left eye of the user and a pupil of the right eye of the user, wherein the first eye distance of the device is a first interpupillary distance (IPD), and wherein the second eye distance of the user is a second IPD.

What is claimed is:

1. A method of device adjustment, comprising:

identifying a first eye distance of a display device, wherein the first eye distance of the display device is a length between a left eye display and a right eye display of the display device;

detecting whether the first eye distance of the display device is equivalent to a second eye distance of a user of the display device, wherein the second eye distance of the user is a length between a left eye of the user and a right eye of the user; and adjusting the first eye distance of the display device based on the first eye distance of the display device being inequivalent to the second eye distance of the user, wherein the display device comprises a set of link rods, at least one nut, a set of e-rings, a screw, a guide rod, and a sleeve bearing, wherein the set of e-rings is configured to hold the at least one nut in place with the set of link rods, wherein the guide rod is configured to limit a movement of the at least one nut, and wherein the sleeve bearing is configured to allow the screw to rotate freely.

2. The method of claim 1, wherein adjusting the first eye distance of the display device comprises:

adjusting the first eye distance of the display device until the first eye distance of the display device is approximately equivalent to the second eye distance of the user.

3. The method of claim 2, wherein the first eye distance of the display device is approximately equivalent to the second eye distance of the user if a pupil of the left eye of the user approximately matches a center of the left eye display and a pupil of the right eye of the user approximately matches a center of the right eye display.

4. The method of claim 1, wherein adjusting the first eye distance of the display device comprises:

adjusting the first eye distance of the display device with at least one of: the screw, the guide rod, the set of link rods, the at least one nut, the set of e-rings, or the sleeve bearing.

5. The method of claim 4, wherein adjusting the first eye distance of the display device comprises:

adjusting the screw in order trigger a movement of the at least one nut and the set of link rods that adjusts the first eye distance of the display device.

6. The method of claim 5, wherein adjusting the screw in order trigger the movement of the at least one nut and the set of link rods comprises:

rotating the screw in a clockwise fashion in order trigger a downward movement of the at least one nut and expand the set of link rods that increases the first eye distance of the display device.

7. The method of claim 6, wherein the guide rod is configured to limit the movement of the at least one nut to the downward movement, and wherein the sleeve bearing is configured to allow the screw to rotate freely in the clockwise fashion.

8. The method of claim 5, wherein adjusting the screw in order trigger the movement of the at least one nut and the set of link rods comprises:

rotating the screw in a counterclockwise fashion in order trigger an upward movement of the at least one nut and contract the set of link rods that decreases the first eye distance of the display device.

9. The method of claim 8, wherein the guide rod is configured to limit the movement of the at least one nut to the upward movement, and wherein the sleeve bearing is configured to allow the screw to rotate freely in the counterclockwise fashion.

10. The method of claim 1, further comprising:

outputting an indication of the adjustment of the first eye distance of the display device based on the first eye distance of the display device being inequivalent to the second eye distance of the user;

wherein the first eye distance of the display device is a length between a center of the left eye display and a center of the right eye display, wherein the second eye distance of the user is a length between a pupil of the left eye of the user and a pupil of the right eye of the user, wherein the first eye distance of the display device is a first interpupillary distance (IPD), and wherein the second eye distance of the user is a second IPD.

11. An apparatus for device adjustment, comprising:

at least one memory; and at least one processor coupled to the at least one memory and, based at least in part on information stored in the at least one memory, the at least one processor is configured to:

identify a first eye distance of a display device, wherein the first eye distance of the display device is a length between a left eye display and a right eye display of the display device;

detect whether the first eye distance of the display device is equivalent to a second eye distance of a user of the display device, wherein the second eye distance of the user is a length between a left eye of the user and a right eye of the user; and adjust the first eye distance of the display device based on the first eye distance of the display device being inequivalent to the second eye distance of the user, wherein the display device comprises a set of link rods, at least one nut, a set of e-rings, a screw, a guide rod, and a sleeve bearing, wherein the set of e-rings is configured to hold the at least one nut in place with the set of link rods, wherein the guide rod is configured to limit a movement of the at least one nut, and wherein the sleeve bearing is configured to allow the screw to rotate freely.

12. A device, comprising:

a screw coupled to at least one nut;

a set of link rods coupled to the at least one nut;

a guide rod coupled to the at least one nut;

a sleeve bearing coupled to the screw; and a set of e-rings coupled to at least one of the screw, the at least one nut, or the set of link rods;

wherein the set of link rods is configured to adjust a first eye distance of the device based on the first eye distance of the device being inequivalent to a second eye distance of a user of the device, wherein the first eye distance of the device is a length between a left eye display and a right eye display of the device, wherein the second eye distance of the user is a length between a left eye of the user and a right eye of the user, wherein the set of e-rings is configured to hold the at least one nut in place with the set of link rods, wherein the guide rod is configured to limit a movement of the at least one nut, and wherein the sleeve bearing is configured to allow the screw to rotate freely.

13. The device of claim 12, wherein the set of link rods is configured to adjust the first eye distance of the device until the first eye distance of the device is approximately equivalent to the second eye distance of the user;

wherein the first eye distance of the device is a length between a center of the left eye display and a center of the right eye display, wherein the second eye distance of the user is a length between a pupil of the left eye of the user and a pupil of the right eye of the user, wherein the first eye distance of the device is a first interpupillary distance (IPD), and wherein the second eye distance of the user is a second IPD.

14. The device of claim 13, wherein the first eye distance of the device is approximately equivalent to the second eye distance of the user if a pupil of the left eye of the user approximately matches a center of the left eye display and a pupil of the right eye of the user approximately matches a center of the right eye display.

15. The device of claim 12, wherein an adjustment of the screw is configured to trigger a movement of the at least one nut and the set of link rods in order to adjust the first eye distance of the device.

16. The device of claim 15, wherein the adjustment of the screw comprises: a rotation of the screw in a clockwise fashion configured to trigger a downward movement of the at least one nut and expand the set of link rods that increases the first eye distance of the device.

17. The device of claim 16, wherein the guide rod is configured to limit the movement of the at least one nut to the downward movement, and wherein the sleeve bearing is configured to allow the screw to rotate freely in the clockwise fashion.

18. The device of claim 15, wherein the adjustment of the screw comprises: a rotation of the screw in a counterclockwise fashion configured to trigger an upward movement of the at least one nut and contract the set of link rods that decreases the first eye distance of the device.

19. The device of claim 18, wherein the guide rod is configured to limit the movement of the at least one nut to the upward movement, and wherein the sleeve bearing is configured to allow the screw to rotate freely in the counterclockwise fashion.

* * * * *